(12) United States Patent
Muto

(10) Patent No.: US 11,547,018 B2
(45) Date of Patent: Jan. 3, 2023

(54) SEMICONDUCTOR STORAGE DEVICE

(71) Applicant: Kioxia Corporation, Minato-ku (JP)

(72) Inventor: Mitsuhiro Muto, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 72 days.

(21) Appl. No.: 16/783,227

(22) Filed: Feb. 6, 2020

(65) Prior Publication Data
US 2021/0015006 A1 Jan. 14, 2021

(30) Foreign Application Priority Data

Jul. 9, 2019 (JP) .............................. JP2019-127723

(51) Int. Cl.
*H05K 7/20* (2006.01)
*H05K 5/02* (2006.01)
*H05K 1/18* (2006.01)
*H05K 1/02* (2006.01)
(Continued)

(52) U.S. Cl.
CPC ....... *H05K 7/20436* (2013.01); *H05K 1/0203* (2013.01); *H05K 1/144* (2013.01); *H05K 1/181* (2013.01); *H05K 5/0008* (2013.01); *H05K 5/0213* (2013.01); *H05K 7/20127* (2013.01); *H05K 2201/042* (2013.01); *H05K 2201/10015* (2013.01); *H05K 2201/10159* (2013.01); *H05K 2201/10522* (2013.01)

(58) Field of Classification Search
CPC .. H05K 7/20436; H05K 1/0203; H05K 1/144; H05K 1/181; H05K 5/0008; H05K 5/0213; H05K 7/20127; H05K 2201/042; H05K 2201/10015; H05K 2201/10159; H05K 2201/10522
See application file for complete search history.

(56) References Cited

U.S. PATENT DOCUMENTS 5,804,875 A * 9/1998 Remsburg ........... H01L 23/4093
174/16.3
7,450,387 B2 * 11/2008 Cheng .................. H01L 23/367
257/E23.102
(Continued)

FOREIGN PATENT DOCUMENTS

CN 106469693 A 3/2017
CN 206323725 U 7/2017
(Continued)

*Primary Examiner* — Abhishek M Rathod
*Assistant Examiner* — Keith DePew
(74) *Attorney, Agent, or Firm* — Oblon, McClelland, Maier & Neustadt, L.L.P.

(57) ABSTRACT

According to one embodiment, a semiconductor storage device includes a housing, a first board, a heat generating component, an electronic component, and a thermal-conductive sheet. The housing has a first vent hole. The first board is accommodated in the housing. The heat generating component is mounted on the first board. The electronic component is disposed between the heat generating component and the first vent hole. The thermal-conductive sheet is provided to extend over the heat generating component and the electronic component, or provided to extend from a region positioned on a rear side of the heat generating component on the first board to the electronic component.

19 Claims, 21 Drawing Sheets

(51) Int. Cl.
*H05K 1/14* (2006.01)
*H05K 5/00* (2006.01)

(56) References Cited

U.S. PATENT DOCUMENTS

| | | | | |
|---|---|---|---|---|
| 7,746,648 B2* | 6/2010 | Yamada | H01L 23/4006 | 257/713 |
| 8,149,583 B2* | 4/2012 | Ishii | H05K 3/368 | 361/752 |
| 8,687,377 B2* | 4/2014 | Harashima | G06F 1/187 | 361/752 |
| 9,668,377 B2* | 5/2017 | Lim | H05K 1/0203 | |
| 9,807,899 B2* | 10/2017 | Matsuda | H05K 1/144 | |
| 9,958,914 B2* | 5/2018 | Kim | G06F 1/20 | |
| 10,076,063 B2* | 9/2018 | Matsuda | G11B 33/124 | |
| 10,512,182 B2* | 12/2019 | Suzuki | H05K 5/0269 | |
| 10,524,390 B2* | 12/2019 | Suzuki | H05K 1/0203 | |
| 10,833,060 B2* | 11/2020 | Nagasawa | H01L 23/5386 | |
| 10,869,383 B2* | 12/2020 | Suzuki | G11B 33/142 | |
| 10,937,464 B2* | 3/2021 | Long | G11B 33/142 | |
| 11,127,649 B2* | 9/2021 | Shimizu | H05K 5/0217 | |
| 2001/0017764 A1* | 8/2001 | Nakamura | G06F 1/203 | 361/679.48 |
| 2011/0199747 A1* | 8/2011 | Ishii | H05K 3/368 | 361/784 |
| 2011/0199748 A1* | 8/2011 | Kagawa | H05K 7/20436 | 361/796 |
| 2011/0260185 A1* | 10/2011 | Izutani | H01L 33/642 | 257/98 |
| 2012/0250279 A1* | 10/2012 | Harashima | H05K 1/144 | 361/760 |
| 2013/0058039 A1* | 3/2013 | Lee | G06F 1/203 | 361/690 |
| 2014/0022733 A1* | 1/2014 | Lim | H05K 7/20445 | 361/718 |
| 2016/0004284 A1* | 1/2016 | Cohen | G06F 1/203 | 156/185 |
| 2016/0270261 A1* | 9/2016 | Matsuda | G11B 33/124 | |
| 2016/0307818 A1* | 10/2016 | Kawase | H05K 7/20445 | |
| 2017/0060199 A1* | 3/2017 | Kim | G06F 1/20 | |
| 2017/0188477 A1* | 6/2017 | Matsuda | H05K 1/144 | |
| 2017/0265303 A1* | 9/2017 | Zito | H05K 3/3421 | |
| 2018/0242469 A1* | 8/2018 | Suzuki | H05K 7/20472 | |
| 2018/0270943 A1* | 9/2018 | Suzuki | H05K 7/20009 | |
| 2018/0270991 A1* | 9/2018 | Suzuki | H05K 5/006 | |
| 2020/0027866 A1* | 1/2020 | Nagasawa | H01L 23/49816 | |
| 2021/0172397 A1* | 6/2021 | Ito | F02D 41/401 | |

FOREIGN PATENT DOCUMENTS

| | | |
|---|---|---|
| CN | 208387006 U | 1/2019 |
| JP | 2016-167571 A | 9/2016 |
| JP | 2016-207785 A | 12/2016 |
| JP | 6320332 B2 | 5/2018 |
| JP | 2018-136912 A | 8/2018 |
| TW | 201818796 A | 5/2018 |

* cited by examiner

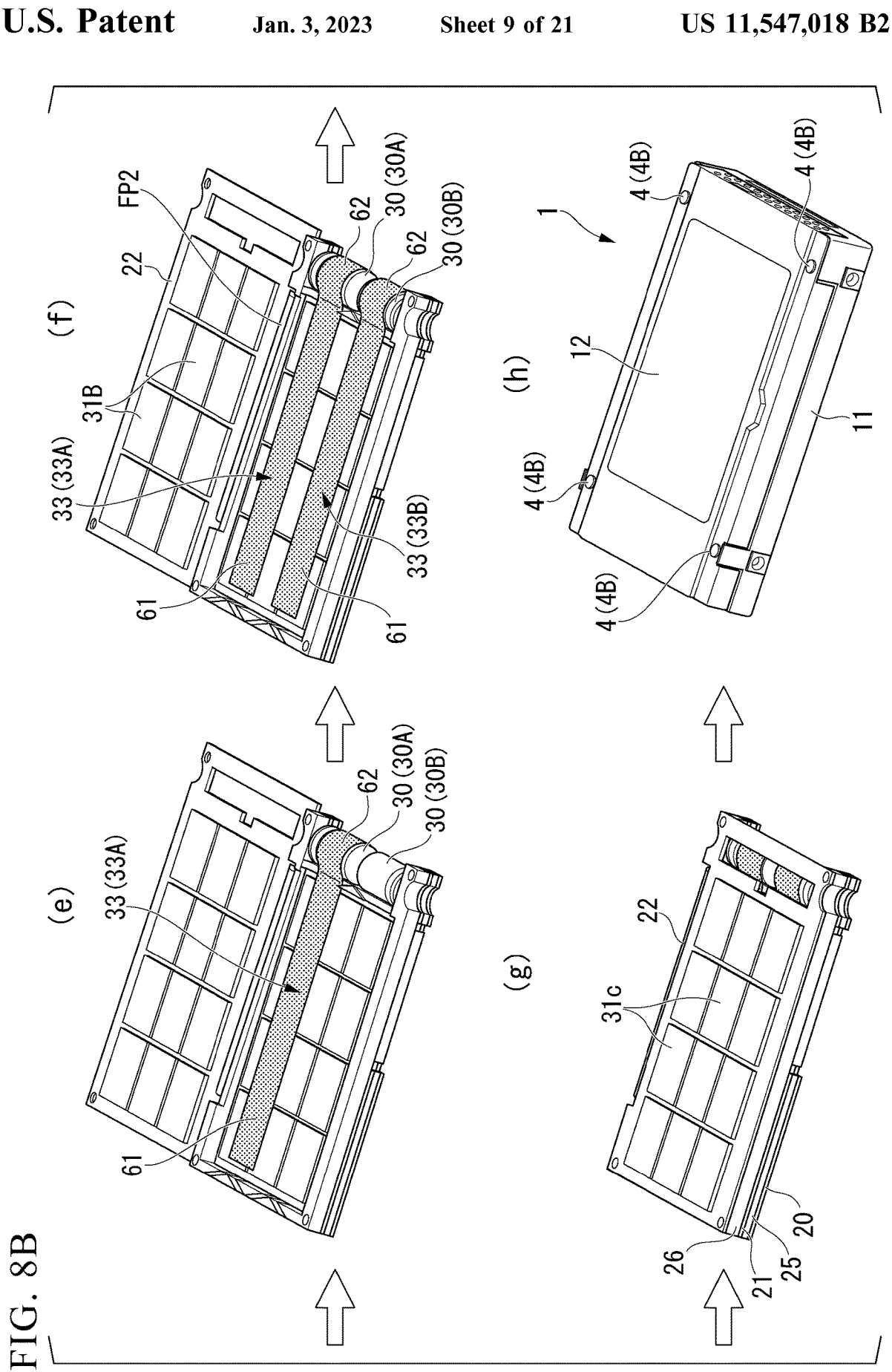

SEMICONDUCTOR STORAGE DEVICE

CROSS-REFERENCE TO RELATED APPLICATION

This application is based upon and claims the benefit of priority from Japanese Patent Application No. 2019-127723, filed Jul. 9, 2019; the entire contents of which are incorporated herein by reference.

FIELD

Embodiments described herein relate generally to a semiconductor storage device.

BACKGROUND

A semiconductor storage device, which includes: a housing; a board accommodated in the housing; and a semiconductor memory component mounted on the board, is known. In semiconductor storage devices, heat dissipation is desired to be improved.

BRIEF DESCRIPTION OF THE DRAWINGS

FIG. 8B is a perspective view illustrating a part of the manufacturing method of the semiconductor storage device of the first embodiment.

DETAILED DESCRIPTION

Figure 1:
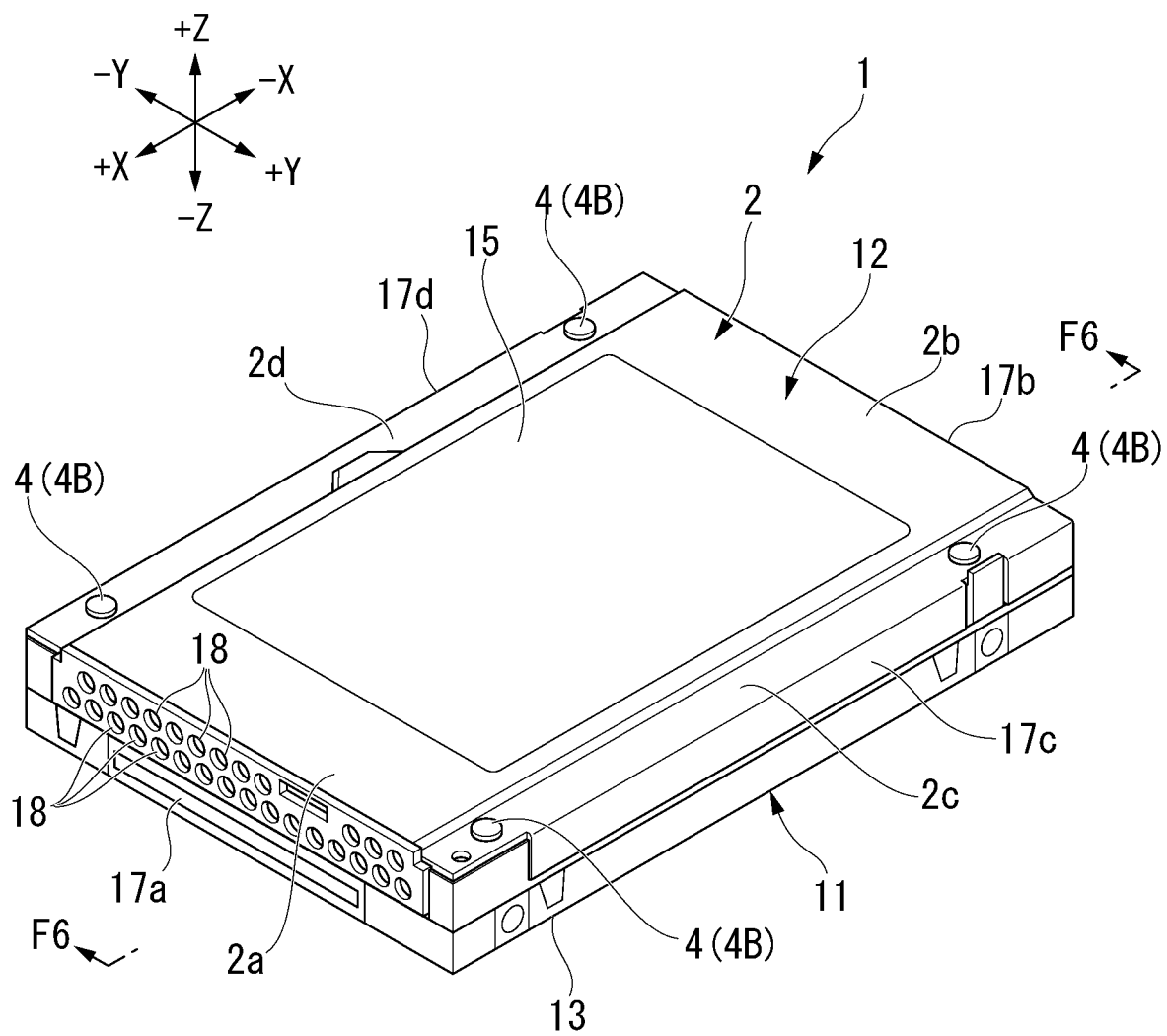
FIG. 1 is a perspective view illustrating a semiconductor storage device of a first embodiment.

Hereinafter, a semiconductor storage device of an embodiment will be described with reference to the drawings. In the following description, constituents having the same or similar function are denoted by the same references. Also, duplicated description of the constituents may be omitted. In the present specification, the term "overlap" means that virtual projection images of two objects overlap each other and includes a case in which two objects are not directly in contact with each other. In the present specification, the terms "parallel" and "perpendicular" include "substantially parallel" and "substantially perpendicular."

Also, first, a +X direction, a −X direction, a +Y direction, a −Y direction, a +Z direction, and a −Z direction will be defined. The +X direction, the −X direction, the +Y direction, and the −Y direction are directions along a first surface 21a (see FIG. 6) of a first sub board 21 to be described below. The +X direction is a direction from a second end 2b toward a first end 2a of a housing 2 to be described below (see FIG. 1). The −X direction is a direction opposite to the +X direction. When the +X direction and the −X direction do not need to be distinguished from each other, the directions will be simply referred to as an "X direction."

The +Y direction and the −Y direction are directions intersecting (for example, perpendicular to) the X direction. The +Y direction is a direction from a fourth end 2d toward a third end 2c of the housing 2 to be described below (see FIG. 1). The −Y direction is a direction opposite to the +Y direction. When the +Y direction and the −Y direction do not need to be distinguished from each other, the directions will be simply referred to as a "Y direction." The +Z direction and the −Z direction are directions intersecting (for example, perpendicular to) the X direction and the Y direction, and are a thickness direction of a main board 20, the first sub board 21, and a second sub board 22 to be described below. The +Z direction is a direction from the first sub board 21 toward the second sub board 22 (see FIG. 2). The −Z direction is a direction opposite to the +Z direction. When the +Z direction and the −Z direction do not need to be distinguished from each other, the directions will be simply referred to as a "Z direction." The −X direction is an example of a "first direction." The −Y direction is an example of a "second direction."

According to one embodiment, a semiconductor storage device includes a housing, a first board, a heat generating component, an electronic component, and a thermal-conductive sheet. The housing has a first vent hole. The first board is accommodated in the housing. The heat generating component is mounted on the first board. The electronic component is disposed between the heat generating component and the first vent hole. The thermal-conductive sheet is provided to extend over the heat generating component and the electronic component, or provided to extend from a region positioned on a rear side of the heat generating component on the first board to the electronic component.

First Embodiment

[1. Overall Configuration]

A semiconductor storage device 1 according to a first embodiment will be described with reference to FIGS. 1 to 8B. The semiconductor storage device 1 is a storage device such as a solid state drive (SSD). The semiconductor storage device 1 is attached to an information processing device such as a server or a personal computer and is used as a storage region of the information processing device. In the present specification, an information processing device to which the semiconductor storage device 1 is attached is referred to as a "host device."

Figure 2:
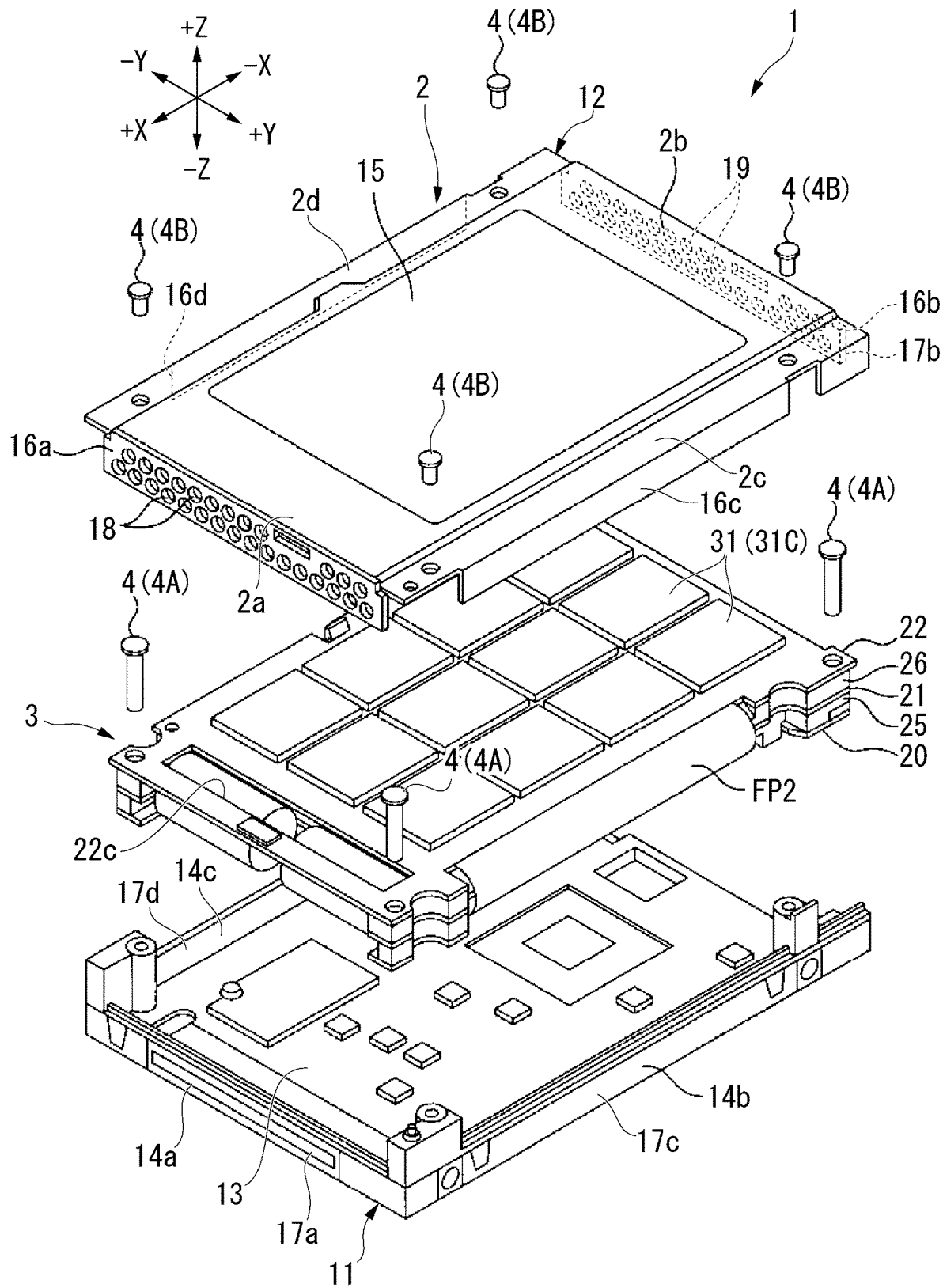
FIG. 2 is a partially exploded perspective view illustrating the semiconductor storage device of the first embodiment.

FIG. 1 is a perspective view illustrating the semiconductor storage device 1. FIG. 2 is a partially exploded perspective view illustrating the semiconductor storage device 1. As illustrated in FIGS. 1 and 2, the semiconductor storage device 1 may include, for example, the housing 2, a board assembly 3, and a plurality of fastening members 4.

The housing 2 may be formed, for example, in a rectangular box shape. The housing 2 may be made of, for example, metal. As a pair of ends separated in a longitudinal direction of the housing 2, the housing 2 includes the first end 2a and the second end 2b positioned on a side opposite to the first end 2a. As a pair of ends separated in a short-side direction of the housing 2, the housing 2 includes the third end 2c and the fourth end 2d positioned on a side opposite to the third end 2c.

The housing 2 includes a base 11 and a cover 12 and is formed by combining the base 11 and the cover 12. The base 11 includes a first main wall 13 and first to third side wall portions 14a, 14b, and 14c. The first main wall 13 is a wall parallel to the X direction and the Y direction. The first to third side wall portions 14a, 14b, and 14c stand upright in the +Z direction from the first main wall 13 at the first, third, and fourth ends 2a, 2c, and 2d. The cover 12 includes a second main wall 15 and first to fourth side wall portions 16a, 16b, 16c, and 16d. The second main wall 15 is a wall parallel to the X direction and the Y direction. The first to fourth side wall portions 16a, 16b, 16c, and 16d extend in the −Z direction from the second main wall 15 at the first to fourth ends 2a, 2b, 2c, and 2d.

A side wall 17a on the +X direction side of the housing 2 is formed by the first side wall portion 14a of the base 11 and the first side wall portion 16a of the cover 12. A side wall 17b on the −X direction side of the housing 2 is formed by the second side wall portion 16b of the cover 12. A side wall 17c on the +Y direction side of the housing 2 is formed by the second side wall portion 14b of the base 11 and the third side wall portion 16c of the cover 12. A side wall 17d on the −Y direction side of the housing 2 is formed by the third side wall portion 14c of the base 11 and the fourth side wall portion 16d of the cover 12.

A plurality of first vent holes 18 are provided in the first end 2a of the housing 2. For example, the plurality of first vent holes 18 are provided in the first side wall portion 16a of the cover 12. Similarly, a plurality of second vent holes 19 are provided in the second end 2b of the housing 2. For example, the plurality of second vent holes 19 are provided in the second side wall portion 16b of the cover 12.

Here, any one of the first vent holes 18 and the second vent holes 19 may function as suction holes, and any one of them may function as exhaust holes. For example, when the semiconductor storage device 1 is placed where air flows to the −X direction, air outside the housing 2 flows into the housing 2 from the first vent holes 18 and is exhausted to the outside of the housing 2 through the second vent holes 19. On the other hand, when the semiconductor storage device 1 is placed where air flows to the +X direction, air outside the housing 2 flows into the housing 2 from the second vent holes 19 and is exhausted to the outside of the housing 2 through the first vent holes 18. In the following description, an example in which the semiconductor storage device 1 is placed where air flows to the −X direction will be described.

The board assembly 3 is accommodated in the housing 2. The board assembly 3 will be described in detail below with reference to FIG. 3.

The plurality of fastening members 4 may include, for example, a plurality of first fastening members 4A and a plurality of second fastening members 4B. The first fastening members 4A fix the board assembly 3 to the base 11. The second fastening members 4B fix the cover 12 to the base 11.

[2. Configuration of Board Assembly]

[2.1 Overall Configuration of Board Assembly]

Next, an overall configuration of the board assembly 3 will be described.

Figure 3:
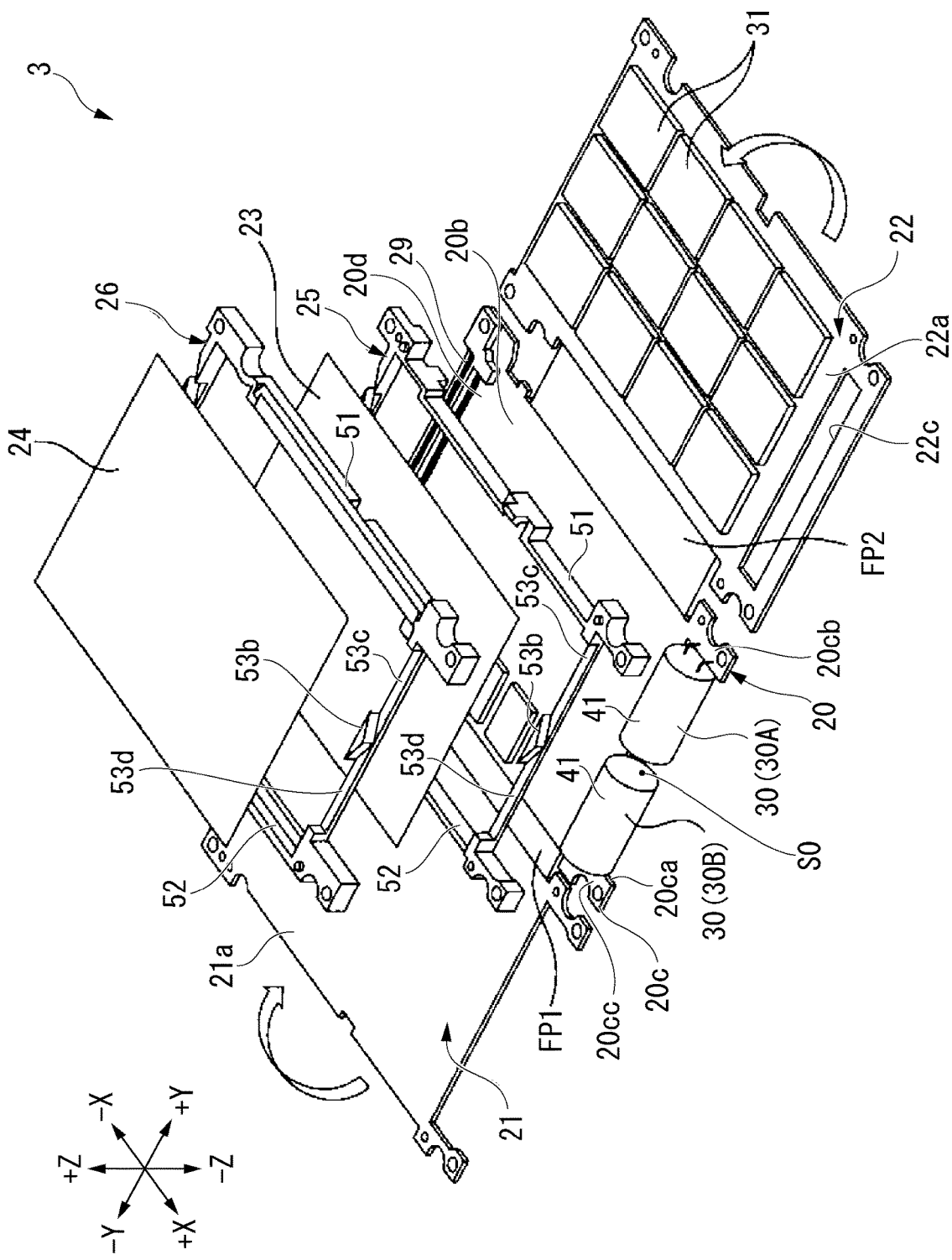
FIG. 3 is a partially exploded perspective view illustrating a board assembly of the semiconductor storage device of the first embodiment.

FIG. 3 is a partially exploded perspective view illustrating the board assembly 3. The board assembly 3 may include, for example, the main board 20, the first sub board 21, the second sub board 22, a first insulating sheet 23, a second insulating sheet 24, a first spacer 25, a second spacer 26, a controller 27 (see FIG. 4), a plurality of dynamic random access memories (DRAMs) 28 (see FIG. 4), an external connector 29, a plurality of capacitors 30, a plurality of NAND flash memories 31 (only some thereof are illustrated in FIG. 3, and hereinafter referred to as "NANDs 31"), a plurality of thermal connection components 32 (see FIG. 6), and a plurality of thermal-conductive sheets 33 (see FIGS. 6 and 7). However, the semiconductor storage device 1 is not limited to the above-described example. The semiconductor storage device 1 corresponds to various general semiconductor storage devices and may have a board having a size or a shape other than those illustrated in the figures and may not include DRAMs.

Figure 6:
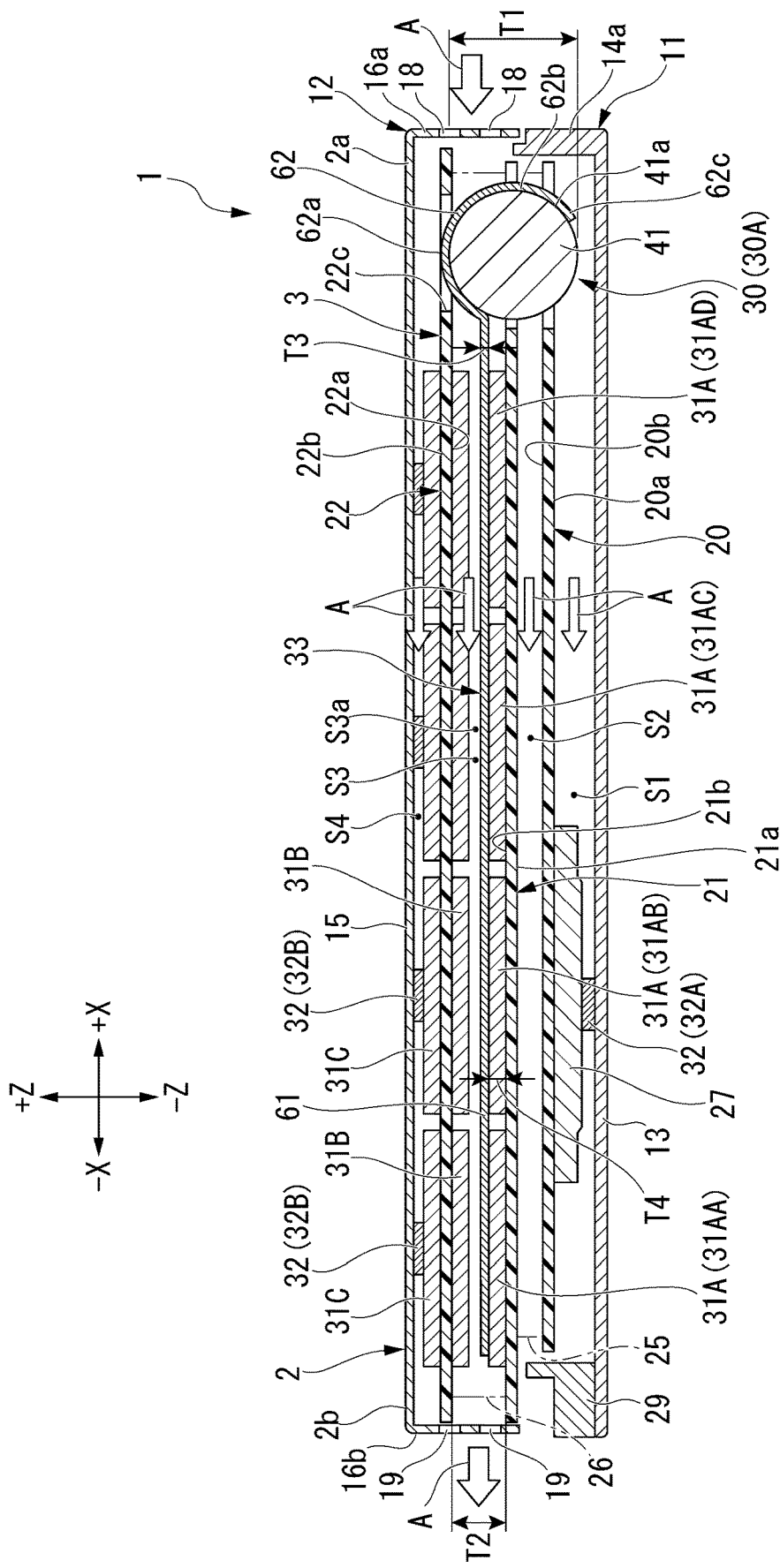
FIG. 6 is a cross-sectional view taken along line F6-F6 of the semiconductor storage device illustrated in FIG. 1.

Among the three boards (the main board 20, the first sub board 21, and the second sub board 22), the main board 20 is positioned furthest in the −Z direction (see FIG. 6). The main board 20 is disposed between an inner surface of the first main wall 13 of the housing 2 and the first sub board 21. The main board 20 is parallel to the X direction and the Y direction. The main board 20 includes a first surface 20a facing the first main wall 13 of the housing 2 and a second surface 20b positioned on a side opposite to the first surface 20a and facing the first sub board 21.

The first sub board 21 is disposed between the main board 20 and the second sub board 22 (see FIG. 6). The first sub board 21 is parallel to the X direction and the Y direction. The first sub board 21 includes the first surface 21a facing the main board 20 and a second surface 21b positioned on a side opposite to the first surface 21a and facing the second sub board 22. The first sub board 21 is an example of the "first board."

Among the three boards (the main board 20, the first sub board 21, and the second sub board 22), the second sub board 22 is positioned furthest in the +Z direction (see FIG. 6). The second sub board 22 is disposed between the first sub board 21 and an inner surface of the second main wall 15 of the housing 2. In the present embodiment, the second sub board 22 is disposed between a plurality of NANDs 31A (target components for heat dissipation using the thermal-conductive sheets 33 to be described below) mounted on the second surface 21b of the first sub board 21 and the inner surface of the second main wall 15 of the housing 2. The second sub board 22 is parallel to the X direction and the Y direction. The second sub board 22 includes a first surface 22a facing the first sub board 21, and a second surface 22b positioned on a side opposite to the first surface 22a and facing the second main wall 15 of the housing 2. The second sub board 22 includes an opening 22c that avoids interference with the capacitors 30 to be described below. The second sub board 22 is an example of a "second board."

As illustrated in FIG. 3, in the present embodiment, a first flexible wiring board (first flexible connection portion) FP1 is provided between the main board 20 and the first sub board 21. The first flexible wiring board FP1 connects an end in the −Y direction of the main board 20 and an end in the +Y direction of the first sub board 21 before the semiconductor storage device 1 is assembled (an end to be of the −Y direction thereof after the semiconductor storage device 1 is assembled). The main board 20 and the first sub board 21 are electrically connected via the first flexible wiring board FP1.

Similarly, a second flexible wiring board (second flexible connection portion) FP2 is provided between the main board 20 and the second sub board 22. The second flexible wiring board FP2 connects an end in the +Y direction of the main board 20 and an end in the −Y direction of the second sub board 22 before the semiconductor storage device 1 is assembled (an end to be of the +Y direction thereof after the semiconductor storage device 1 is assembled). The main board 20 and the second sub board 22 are electrically connected via the second flexible wiring board FP2.

In the present embodiment, the main board 20, the first sub board 21, the second sub board 22, the first flexible wiring board FP1, and the second flexible wiring board FP2 are integrally formed as a rigid flexible board. Instead of this, the main board 20, the first sub board 21, and the second sub board 22 may be formed separately from each other and electrically connected via flexible wiring boards or board-to-board connectors (B to B connectors).

The first insulating sheet 23 is disposed between the main board 20 and the first sub board 21. The second insulating sheet 24 is disposed between the first sub board 21 and the second sub board 22. In the present embodiment, the second insulating sheet 24 is disposed between the thermal-conductive sheets 33 (see FIG. 6) and the second sub board 22. For convenience of description, the insulating sheets 23 and 24 are not illustrated in the drawings described below.

The first spacer 25 is interposed between the main board 20 and the first sub board 21 and separates the main board 20 and the first sub board 21 from each other. In other words, the first spacer 25 forms a gap through which air flows between the main board 20 and the first sub board 21. The first spacer 25 may be formed, for example, in a frame shape matching with the outer shape of the main board 20 or the first sub board 21. The first spacer 25 may be made, for example, of a synthetic resin. Details of the shape of the first spacer 25 will be described below.

The second spacer 26 is interposed between the first sub board 21 and the second sub board 22 and separates the first sub board 21 and the second sub board 22 from each other. In other words, the second spacer 26 forms a gap through which air flows between the first sub board 21 and the second sub board 22. The second spacer 26 is formed, for example, in a frame shape matching with the outer shape of the first sub board 21 or the second sub board 22. The second spacer 26 may be made, for example, of a synthetic resin. Details of the shape of the second spacer 26 will be described below.

The controller (controller component, see FIG. 4) 27 may be mounted, for example, on the first surface 20a of the main board 20. The controller 27 generally controls the entire semiconductor storage device 1. The controller 27 may be configured, for example, as a system-on-a-chip (SoC) in which a host interface circuit for a host device, a control circuit that controls the plurality of DRAMs 28, a control circuit that controls the plurality of NANDs 31, and the like are integrated in one semiconductor chip.

The DRAMs 28 (see FIG. 4) may be mounted, for example, on the first surface 20a of the main board 20.

The DRAM 28 is an example of a volatile semiconductor memory chip. The DRAM 28 serves as a data buffer in which data received from the host device and data read from the NAND 31 are temporarily stored.

The external connector 29 may be mounted, for example, on the second surface 20b of the main board 20. The external connector 29 has a plurality of metal terminals and can be connected to a host device.

The plurality of capacitors 30 may be mounted, for example, on the second surface 20b of the main board 20. The capacitors 30 each function as a backup power supply for data protection at the time of unexpected power interruption. For example, when power supply from the host device is unexpectedly interrupted, the capacitors 30 supply power to the controller 27, the DRAMs 28, the NANDs 31, and the like for a certain period of time. That is, the capacitors 30 supply power to the controller 27, the DRAMs 28, the NANDs 31, and the like until data temporarily stored in the DRAMs 28 is written to the NANDs 31. The capacitor 30 may be, for example, an aluminum electrolytic capacitor or a conductive polymer tantalum solid electrolytic capacitor but is not limited thereto. The capacitor 30 is an example of an "electronic component." In the present specification, the term "electronic component" broadly means a component whose temperature is relatively lower than a "heat generating component" to be described below, and may be a component that generates heat.

The plurality of NANDs 31 include a plurality of NANDs 31A mounted on the second surface 21b of the first sub board 21, a plurality of NANDs 31B mounted on the first surface 22a of the second sub board 22, and a plurality of NANDs 31C mounted on the second surface 22b of the second sub board 22 (see FIG. 6). The NAND 31 is an example of a nonvolatile semiconductor memory chip and an example of a "semiconductor memory component."

Each of the plurality of thermal connection components 32 may have, for example, elasticity (or flexibility). The plurality of thermal connection components 32 may include, for example, a plurality of first thermal connection components 32A and a plurality of second thermal connection components 32B as illustrated in FIG. 6 (only one first thermal connection component 32A corresponding to the controller 27 is illustrated in FIG. 6). The first thermal connection components 32A are interposed between the controller 27 or the DRAMs 28 and the first main wall 13 of the housing 2, and thermally connects the controller 27 or the DRAMs 28 to the housing 2. Therefore, some of the heat generated in the main board 20 is conducted to the housing 2 via the first thermal connection component 32A. On the other hand, the second thermal connection components 32B are interposed between the NANDs 31C mounted on the second surface 22b of the second sub board 22 and the second main wall 15 of the housing 2, and thermally connect the NANDs 31C to the housing 2. Therefore, some of the heat generated in the second sub board 22 is conducted to the housing 2 via the second thermal connection components 32B.

The thermal-conductive sheets 33 are provided to extend over the capacitors 30 and the plurality of NANDs 31A mounted on the second surface 21b of the first sub board 21, and thermally connect the plurality of NANDs 31A and the capacitors 30 (see FIG. 6). The thermal-conductive sheet 33 will be described in detail below.

[2.2 Disposition Configuration on Main Board]

Next, a disposition configuration of the controller 27, the DRAMs 28, the external connector 29, and the capacitors 30 on the main board 20 will be described.

Figure 4:
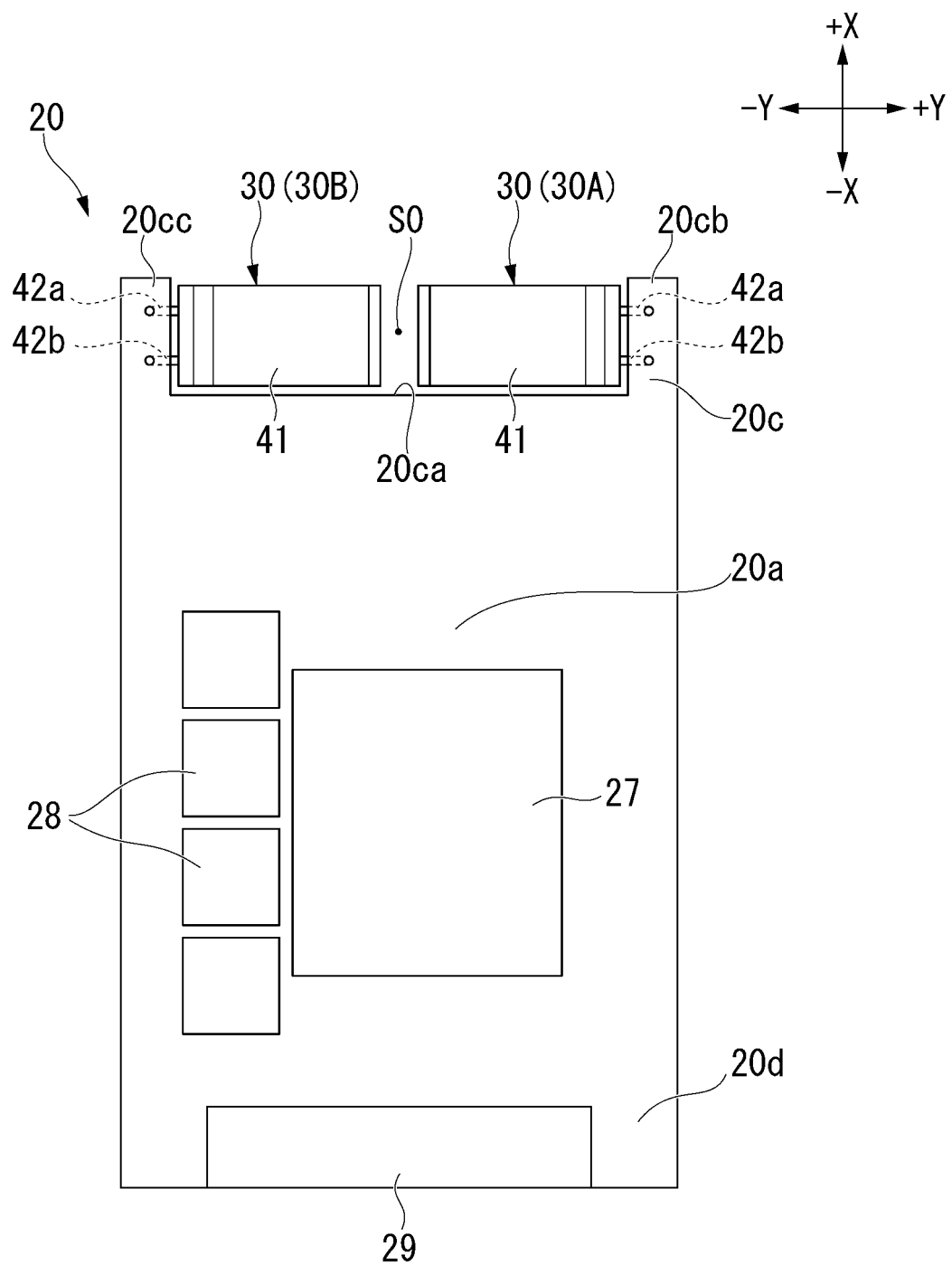
FIG. 4 is a plan view illustrating a first surface of a main board of the semiconductor storage device of the first embodiment.

FIG. 4 is a plan view illustrating the first surface 20a of the main board 20. The main board 20 has a first end 20c and a second end 20d positioned on a side opposite to the first end 20c. The first end 20c is an end that corresponds to the first end 2a of the housing 2. The second end 20d is an end that corresponds to the second end 2b of the housing 2. The first end 20c has a notch 20ca that avoids the plurality of capacitors 30. The first end 20c includes a first protrusion 20cb and a second protrusion 20cc that are provided separately on opposite sides of the notch 20ca. The first protrusion 20cb is provided at an edge on the +Y direction side and protrudes to the +X direction. The second protrusion 20cc is provided at an edge on the −Y direction side and protrudes to the +X direction.

In the present embodiment, the controller 27 is disposed closer to the second end 20d than to the first end 20c on the main board 20. On the other hand, the plurality of capacitors 30 are disposed in the first end 20c of the main board 20. In the present embodiment, the plurality of capacitors 30 include a first capacitor 30A and a second capacitor 30B. Each of the first capacitor 30A and the second capacitor 30B includes a capacitor body 41 provided in a cylindrical shape and a pair of terminals 42a and 42b protruding from an end of the capacitor body 41.

The capacitor bodies 41 of the first capacitor 30A and the second capacitor 30B are accommodated in the notch 20ca of the main board 20. For example, the capacitor body 41 of the first capacitor 30A and the capacitor body 41 of the second capacitor 30B are disposed in the Y direction and aligned to each other in the Y direction. A gap S0 is provided between the first capacitor 30A and the second capacitor 30B.

The terminals 42a and 42b of the first capacitor 30A are connected to the first protrusion 20cb of the main board 20. Therefore, the first capacitor 30A is supported by the first protrusion 20cb of the main board 20. The terminals 42a and 42b of the second capacitor 30B are connected to the second protrusion 20cc of the main board 20. Therefore, the second capacitor 30B is supported by the second protrusion 20cc of the main board 20.

[2.3 First and Second Spacers]

Next, the first spacer 25 and the second spacer 26 will be described. Here, the second spacer 26 will be described as a representative.

Figure 5:
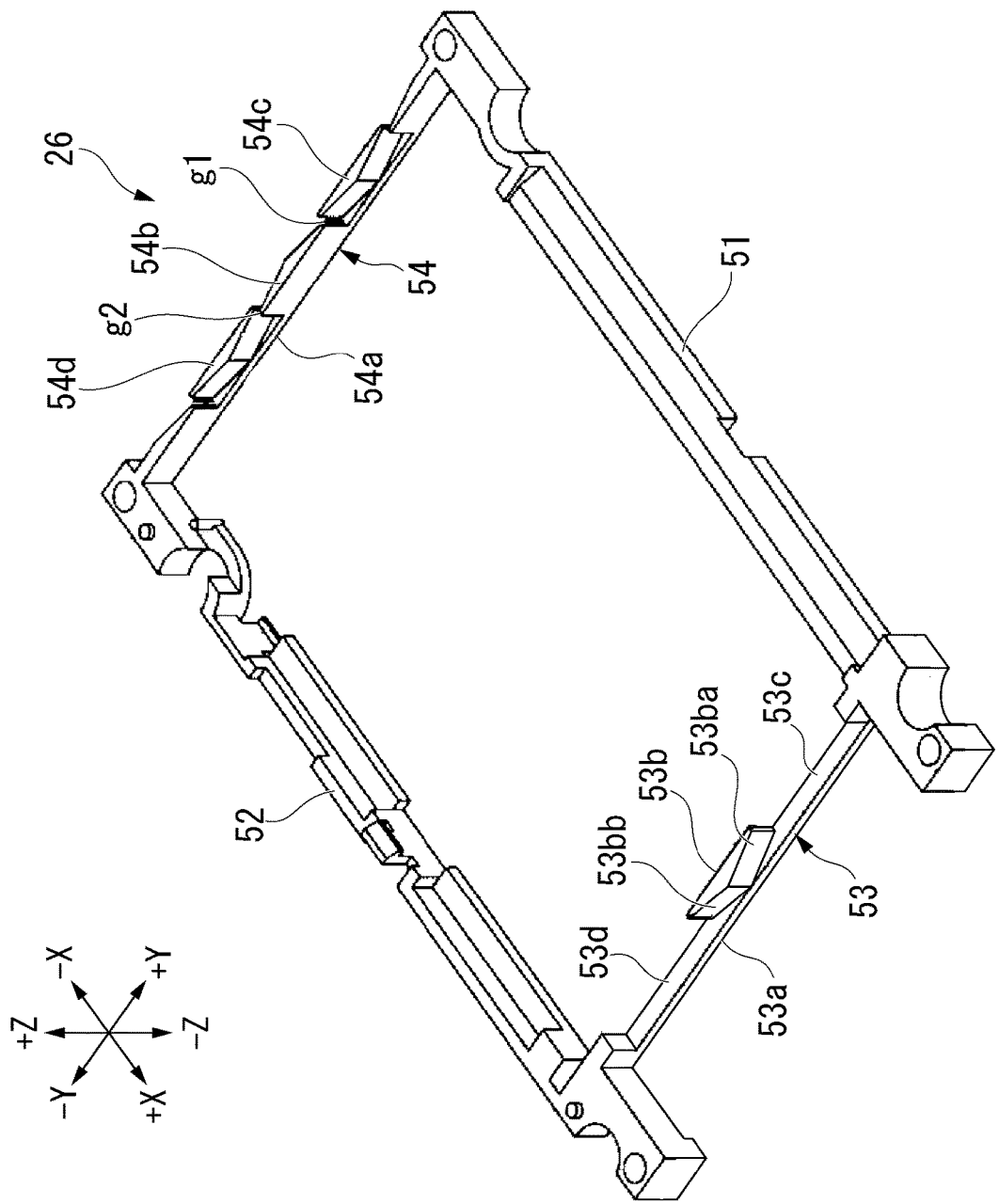
FIG. 5 is a perspective view illustrating a second spacer of the semiconductor storage device of the first embodiment.

FIG. 5 is a perspective view illustrating the second spacer 26. The second spacer 26 includes a first part 51, a second part 52, a third part 53, and a fourth part 54. The first part 51 and the second part 52 are separated from each other in the Y direction and extend in the X direction. The first part 51 is positioned in the +Y direction with respect to the second part 52. The third part 53 and the fourth part 54 are separated from each other in the X direction and extend in the Y direction. The third part 53 is positioned in the +X direction with respect to the fourth part 54. The first to fourth parts 51, 52, 53, and 54 are connected to each other and form the frame-shaped second spacer 26. The thicknesses of the first part 51 and the second part 52 in the Z direction correspond to a distance between the first sub board 21 and the second sub board 22 (thickness of a gap S3 to be described below).

In the present embodiment, the third part 53 includes a base portion 53a and a guide portion 53b. The base portion 53a extends in the Y direction to connect the first part 51 and the second part 52. The thickness of the base portion 53a in the Z direction is smaller than the thicknesses of the first part 51 and the second part 52 in the Z direction. Therefore, a first recess 53c which forms a gap between the base portion 53a and the second sub board 22 is provided between the first part 51 and the guide portion 53b. Similarly, a second recess 53d which forms a gap between the base portion 53a and the second sub board 22 is provided between the second part 52 and the guide portion 53b. Air that has flowed into the housing 2 from the first vent holes 18 passes through the first recess 53c and the second recess 53d and flows into the gap S3 between the first sub board 21 and the second sub board 22.

The guide portion 53b is provided at the center in the Y direction of the base portion 53a. The guide portion 53b stands upright to the +Z direction from the base portion 53a and faces the gap S0 between the first capacitor 30A and the second capacitor 30B from the +X direction. The guide portion 53b is formed in a chevron shape that is directed to the +X direction. The guide portion 53b includes a first inclined portion 53ba and a second inclined portion 53bb.

The first inclined portion 53ba is provided between the center in the Y direction of the guide portion 53b and an end in the +Y direction of the guide portion 53b. The first inclined portion 53ba is inclined such that it is positioned further in the −X direction as it proceeds to the +Y direction. The first inclined portion 53ba guides at least some of the air that has flowed into the housing 2 from the first vent holes 18 and hit the first inclined portion 53ba toward the rear of the first capacitor 30A.

On the other hand, the second inclined portion 53bb is provided between the center in the Y direction of the guide portion 53b and an end in the −Y direction of the guide portion 53b. The second inclined portion 53bb is inclined such that it is positioned further in the −X direction as it proceeds to the −Y direction. At least a part of the second inclined portion 53bb guides the air that has flowed into the housing 2 from the first vent holes 18 and hit the second inclined portion 53bb toward the rear of the second capacitor 30B.

Similarly, the fourth part 54 includes a base portion 54a, a first guide portion 54h, a second guide portion 54c, and a third guide portion 54d. The base portion 54a extends in the Y direction to connect the first part 51 and the second part 52. The thickness of the base portion 54a in the Z direction is smaller than the thicknesses of the first part 51 and the second part 52 in the Z direction.

The first guide portion 54b is provided at the center in the Y direction of the base portion 54a. The first guide portion 54b stands upright to the +Z direction from the base portion 54a. The first guide portion 54b is formed in a chevron shape that is directed in the −X direction. The second guide portion 54c is disposed between the first guide portion 54b and the first part 51 on the base portion 54a. The second guide portion 54c is formed in a chevron shape that is directed in the +X direction. A gap g1 through which the air that has flowed through the gap S3 between the first sub board 21 and the second sub board 22 flows toward the second vent holes 19 is formed between the first guide portion 54b and the second guide portion 54c. On the other hand, the third guide portion 54d is disposed between the first guide portion 54b and the second part 52 on the base portion 54a. The third guide portion 54d is formed in a chevron shape that is directed in the +X direction. A gap g2 through which the air that has flowed through the gap S3 between the first sub board 21 and the second sub board 22 flows toward the second vent holes 19 is formed between the first guide portion 54b and the third guide portion 54d.

[3. Thermal-Conductive Sheet]

Next, the thermal-conductive sheet 33 will be described.

FIG. 6 is a cross-sectional view taken along line F6-F6 of the semiconductor storage device 1 illustrated in FIG. 1. In the present embodiment, the thermal-conductive sheets 33 are provided to conduct heat of one or more NANDs 31A mounted on the second surface 21b of the first sub board 21 to the capacitors 30. The NAND 31A is an example of the "heat generating component."

Here, first, an example of the capacitor 30 will be further described with reference to FIG. 6. In the present embodiment, the capacitors 30 are disposed between the NANDs 31A and the first vent holes 18 of the housing 2. In the present specification, "electronic component disposed between the heat generating component and the first vent holes" means that the electronic component is positioned between the heat generating component and the first vent holes in a plan view when viewed from a direction perpendicular to a surface of the first sub board (first board). That is, the position of the electronic component in the Z direction may not be between the heat generating component and the first vent holes.

In the present embodiment, the capacitor 30 is a relatively large component and has a larger heat capacity than the NAND 31A. For example, a thickness T1 of the capacitor 30 in the Z direction may be larger than a size of the first vent holes 18 in the Z direction. For example, the thickness T1 of the capacitor 30 in the Z direction may be larger than a height T2 in the Z direction of the gap S3 between the first sub board 21 and the second sub board 22. For example, an end in the −Z direction of the capacitor 30 is positioned on the −Z direction side with respect to the first surface 20a of the main board 20. On the other hand, an end in the +Z direction of the capacitor 30 is positioned on the +Z direction side with respect to a surface in the +Z direction of the NAND 31A mounted on the second surface 21b of the first sub board 21.

At least a part of an outer shape of the capacitor body 41 has a curved surface 41a. The curved surface 41a may have a curved surface, for example, with a central angle of 180 degrees or more. In the present embodiment, the capacitor body 41 is formed in a cylindrical shape. Therefore, the curved surface 41a has a curved surface with a central angle of 360 degrees.

The thermal-conductive sheets 33 are provided to extend over at least one of the NANDs 31A and the capacitors 30, and thermally connect the at least one of the NANDs 31A and the capacitors 30. In the present specification, "thermally connecting the NANDs 31A and the capacitors 30" means that at least some of the heat of the NANDs 31A can be transferred to the capacitors 30, and means that a temperature difference between the NANDs 31A and the capacitors 30 is small compared to a case in which the thermal-conductive sheet 33 is not provided. Also, "thermally connecting the NANDs 31A and the capacitors 30" includes a case in which there is another member between the thermal-conductive sheets 33 and the NANDs 31A and/or between the thermal-conductive sheets 33 and the capacitors 30, and the NANDs 31A and the capacitors 30 are thermally connected via the above-described another member as well as the thermal-conductive sheets 33.

In the present embodiment, the thermal-conductive sheet 33 is a rectangular sheet extending in the X direction. The thermal-conductive sheets 33 are affixed to the NANDs 31A and the capacitors 30, for example, with adhesive provided on one surface of each of the thermal-conductive sheets 33. A thickness T3 in the Z direction of the thermal-conductive sheet 33 is smaller than a thickness T2 in the Z direction of the second spacer 26. Furthermore, the thickness T3 in the Z direction of the thermal-conductive sheet 33 is smaller than a thickness T4 in the Z direction of the NAND 31A. Here, the thickness T2 in the Z direction of the second spacer 26 may be, for example, 5 mm. On the other hand, the thickness T3 in the Z direction of the thermal-conductive sheet 33 may be, for example, 0.1 mm or less.

The thermal-conductive sheets 33 may have, for example, flexibility (plasticity). An example of the thermal-conductive sheets 33 is a graphite sheet but is not limited thereto. Each of the thermal-conductive sheets 33 may include, for example, a first part 61 attached to some of the plurality of NANDs 31A and a second part 62 attached to the capacitor 30.

[3.1 First Part of Thermal-Conductive Sheet]

The first part 61 is disposed between the first sub board 21 and the second sub board 22 and has a flat plate shape extending in the X direction. More specifically, the first part 61 is disposed between the NANDs 31A mounted on the first sub board 21 and the NANDs 31B mounted on the second sub board 22. The first part 61 is attached to the plurality of NANDs 31A from a side opposite to the first sub board 21.

In the present embodiment, a gap S3a through which air can flow is present between the thermal-conductive sheets 33 and the second sub board 22. More specifically, there is the gap S3a through which air can flow between the thermal-conductive sheets 33 and the NANDs 31B mounted on the first surface 22a of the second sub board 22.

As illustrated in FIG. 6, the NANDs 31A mounted on the first sub board 21 may include, for example, a NAND 31AA, a NAND 31AB, a NAND 31AC, and a NAND 31AD. The NAND 31AA, the NAND 31AB, the NAND 31AC, and the NAND 31AD are aligned in this order in the +X direction. That is, the NAND 31AB is disposed between the NAND 31AA and the capacitor 30. The NAND 31AA is an example of a "first semiconductor memory component." The NAND 31AB is an example of a "second semiconductor memory component."

In the present embodiment, the first part 61 of one of the thermal-conductive sheets 33 overlaps the NANDs 31AA, 31AB, 31AC, and 31AD in the Z direction. The first part 61 of the thermal-conductive sheet 33 may be attached to all the NANDs 31AA, 31AB, 31AC, and 31AD.

The thermal-conductive sheet 33 thermally connects the NANDs 31AA, 31AB, 31AC, and 31AD and the capacitor 30 accordingly.

In the present embodiment, the NANDs 31AA and 31AB are positioned closer to the second vent holes 19 than to the first vent holes 18 of the housing 2. On the other hand, the capacitor 30 is positioned closer to the first vent holes 18 than to the second vent holes 19 of the housing 2. Then, the thermal-conductive sheet 33 extends from the NANDs 31AA and 31AB to the capacitor 30.

In the present embodiment, at least a part of each of the NANDs 31AA, 31AB, and 31AC overlaps the controller 27 in the Z direction. Thus, heat of the NANDs 31AA, 31AB, and 31AC is not easily dissipated. For example, heat of the air flowing between the main board 20 and the first sub board 21 that has been warmed up by the controller 27 and conducted via the main board 20 may be likely transmitted to the NANDs 31AA and 31AB. Therefore, the temperature of NANDs 31AA, 31AB, and 31AC (particularly, NANDs 31AA and 31AB among them) tends to rise. However, in the present embodiment, the heat of the NANDs 31AA, 31AB, and 31AC is dissipated to the capacitor 30 via the thermal-conductive sheet 33.

[3.2 Second Part of Thermal-Conductive Sheet]

The second part 62 of each of the thermal-conductive sheets 33 is attached to the capacitor 30. In the present embodiment, the second part 62 is attached to the curved surface 41a of the capacitor 30 in a state of being bent along the curved surface 41a of the capacitor 30. For example, the second part 62 may be attached to the curved surface 41a of the capacitor 30 in a state of being bent along the curved surface 41a of the capacitor 30 over a central angle of 180 degrees or more.

In the present embodiment, the second part 62 may include, for example, a portion 62a that wraps around the +Z direction side of the capacitor 30, a portion 62b that wraps around the +X direction side of the capacitor 30, and a portion 62c that wraps around the −Z direction side of the capacitor 30. The portion 62a is formed in a circular arc shape at a position between the capacitor 30 and the second main wall 15 of the housing 2 and is attached to the capacitor 30. The portion 62a bulges from the first part 61 to the +Z direction side. The portion 62b is formed in a circular arc shape at a position between the capacitor 30 and the first vent holes 18 and is attached to the capacitor 30. The portion 62c is formed in a circular arc shape at a position between the capacitor 30 and the first main wall 13 of the housing 2 and is attached to the capacitor 30.

In the present embodiment, at least a part of the portion 62b is formed in a curved surface shape (that is, a shape inclined with respect to a direction in which air flows) such that it is positioned further toward the −X direction side as it proceeds to the +Z direction. Therefore, the second part 62 does not readily disturb a flow of the air flowing into the housing 2 from the first vent holes 18. Also, since at least a part of the portion 62b is formed in a curved surface shape, a large surface area of the second part 62 between the capacitor 30 and the first vent holes 18 (that is, a space into which cold air flows from the outside of the housing 2) is secured. Therefore, heat dissipation of the second part 62 is more likely to be promoted.

[3.2 Planar Disposition Structure of Thermal-Conductive Sheet]

Figure 7:
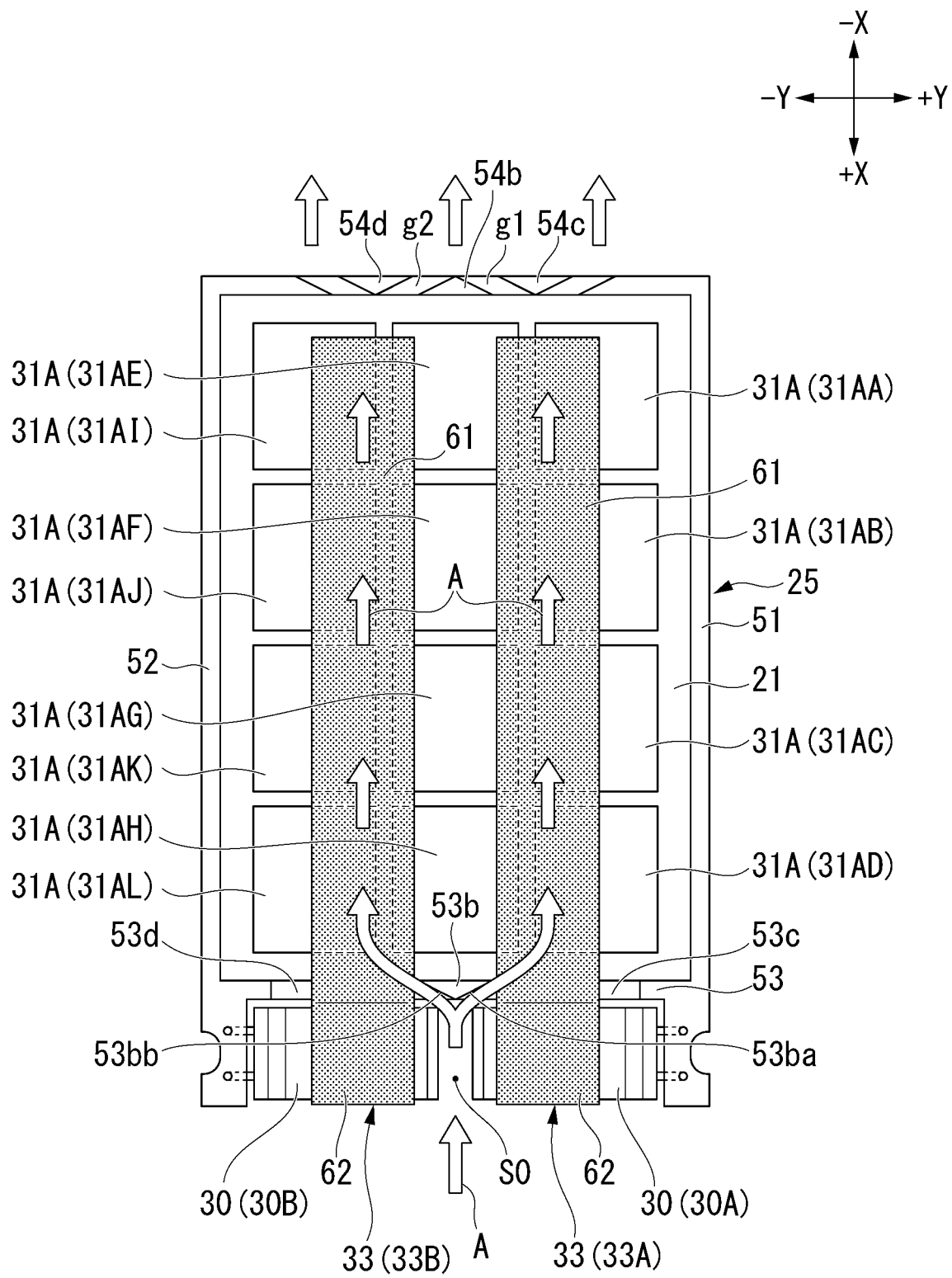
FIG. 7 is a plan view illustrating a planar disposition structure of a thermal-conductive sheet of the semiconductor storage device of the first embodiment.

FIG. 7 is a plan view illustrating a planar disposition structure of the thermal-conductive sheets 30. In the present embodiment, the NANDs 31A mounted on the first sub board 21 includes a first group of NANDs 31AA, 31AB, 31AC, and 31AD, a second group of NANDs 31AE, 31AF, 31AG, and 31AH, and a third group of NANDs 31AI, 31AJ, 31AK, and 31AL. As described above, the first group of NANDs 31AA, 31AB, 31AC, and 31AD are aligned in this order in the +X direction. The second group of NANDs 31AE, 31AF, 31AG, and 31AH are disposed in this order in the +X direction and are positioned in the −Y direction with respect to the first group of NANDs 31AA, 31AB, 31AC, and 31AD. The third group of NANDs 31AI, 31AJ, 31AK, and 31AL are disposed in this order in the +X direction and are positioned in the −Y direction with respect to the second group of NANDs 31AE, 31AF, 31AG, and 31AH.

As illustrated in FIG. 7, the plurality of thermal-conductive sheets 33 include a first thermal-conductive sheet 33A and a second thermal-conductive sheet 33B. The first thermal-conductive sheet 33A is provided to overlap the first group of NANDs 31AA, 31AB, 31AC, and 31AD and the second group of NANDs 31AE, 31AF, 31AG, and 31AH in the Z direction, and is attached to the first group of NANDs 31AA, 31AB, 31AC, and 31AD and the second group of NANDs 31AE, 31AF, 31AG, and 31AH. The first thermal-conductive sheet 33A extends in the X direction through the first recess 53c of the second spacer 26 and is attached to the first capacitor 30A.

On the other hand, the second thermal-conductive sheet 33B is provided to overlap the second group of NANDs 31AE, 31AF, 31AG, and 31AH and the third group of NANDs 31AI, 31AJ, 31AK, and 31AL in the Z direction, and is attached to the second group of NANDs 31AE, 31AF, 31AG, and 31AH and the third group of NANDs 31AI, 31AJ, 31AK, and 31AL. The second thermal-conductive sheet 33B extends in the X direction through the second recess 53d of the second spacer 26 and is attached to the second capacitor 30B.

In the present embodiment, the guide portion 53b of the second spacer 26 is positioned between the first thermal-conductive sheet 33A and the second thermal-conductive sheet 33B. At least a part of the guide portion 53b is disposed at a position at which it does not overlap the first capacitor 30A and the second capacitor 30B when seen from the −X direction. That is, at least a part of the guide portion 53b faces the gap S0 between the first capacitor 30A and the second capacitor 30B in the X direction. The guide portion 53b is positioned on the −X direction side with respect to the first capacitor 30A and the second capacitor 30B.

The first inclined portion 53ba of the guide portion 53b directs the air flowing into the housing 2 from the first vent holes 18 and flowing to the −X direction through the gap S0 between the first capacitor 30A and the second capacitor 30B toward the gap S3a between the first thermal-conductive sheet 33A and the second sub board 22. On the other hand, the second inclined portion 53bb of the guide portion 53b directs the air flowing into the housing 2 from the first vent holes 18 and flowing to the −X direction through the gap S0 between the first capacitor 30A and the second capacitor 30B toward the gap S3a between the second thermal-conductive sheet 33B and the second sub board 22.

[4. Manufacturing Method]

Figure 8A:
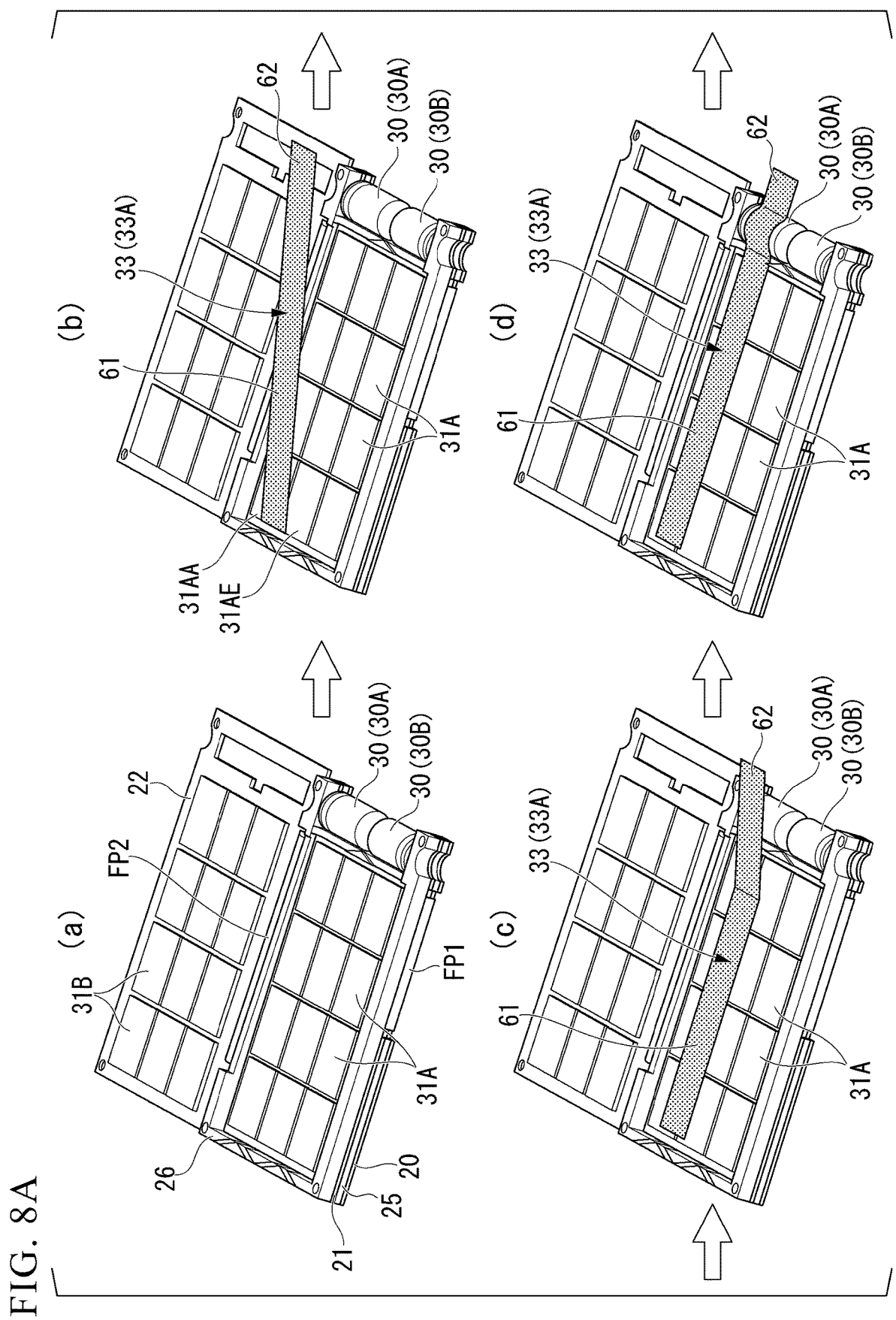
FIG. 8A is a perspective view illustrating a part of a manufacturing method of the semiconductor storage device of the first embodiment.

FIGS. 8A and 8B are perspective views illustrating a part of a manufacturing method of the semiconductor storage device 1. First, the first spacer 25 is placed on the main board 20 and the first flexible wiring board FP1 is bent, and thereby the first sub board 21 is placed on the first spacer 25. Next, the second spacer 26 is placed on the first sub board 21 (Part (a) of FIG. 8A).

Next, an end in the −X direction of the first part 61 of the first thermal-conductive sheet 33A is aligned with an end in the −X direction of the NANDs 31AA and 31AE (Part (b) of FIG. 8A). Then, the first part 61 of the first thermal-conductive sheet 33A is affixed on surfaces of some of the plurality of NANDs 31A (Part (c) of FIG. 8A).

Next, a part of the second part 62 of the first thermal-conductive sheet 33A is affixed to the first capacitor 30A (Part (d) of FIG. 8A). Next, the second part 62 of the first thermal-conductive sheet 33A is wrapped around the first capacitor 30A (Part (e) of FIG. 8B). Similarly, the second thermal-conductive sheet 33B is affixed to some of the plurality of NANDs 31A and the second capacitor 30B (Part (f) of FIG. 8B).

Next, the second flexible wiring board FP2 is bent to place the second sub board 22 on the second spacer 26 (Part (g) of FIG. 8B). The board assembly 3 is assembled accordingly. Next, the assembled board assembly 3 is fixed to the base 11 using the first fastening members 4A (see FIG. 2). Then, the base 11 and the cover 12 are combined to sandwich the board assembly 3 (Part (h) of FIG. 8B). Then, the base 11 and the cover 12 are fixed using the second fastening members 4B (see FIG. 2). The semiconductor storage device 1 is assembled accordingly.

[5. Operation]
[5.1 Operation Related to Thermal Conduction]

First, an operation related to a thermal conduction will be described. As illustrated in FIG. 6, the thermal-conductive sheets 33 thermally connect at least one of the NANDs 31A (plural in the present embodiment) mounted on the first sub board 21 to the capacitors 30. Therefore, some of the heat generated by at least one of the NANDs 31A (plural in the present embodiment) mounted on the first sub board 21 is conducted to the capacitors 30 through the thermal-conductive sheets 33, and is dissipated by the capacitors 30 that are cooled by air. That is, when the thermal-conductive sheets 33 are provided, the capacitors 30 can function as a heat sink that dissipates the heat of the NANDs 31A. Therefore, a temperature rise in the first sub board 21 can be suppressed.

[5.2 Operation Related to Air Flow]

Next, an operation related to an air flow will be described. Arrows A in FIGS. 6 and 7 illustrate an example of the air flow. As illustrated in FIG. 6, when the semiconductor storage device 1 is placed where air flows to the −X direction, air outside the housing 2 flows into the housing 2 from the first vent holes 18.

The air that has flowed into the housing 2 passes through the gap S0 between the two capacitors 30A and 30B, a gap between the capacitors 30 and the first main wall 13 of the housing 2, or a gap between the capacitors 30 and the second main wall 15 of the housing 2, and then flows further to the −X direction side beyond the capacitors 30.

The air flowing to the −X direction side further beyond the capacitors 30 flows to the −X direction sequentially through a gap S1 between the first main wall 13 of the housing 2 and the main board 20, a gap S2 between the main board 20 and the first sub board 21, the gap S3 between the first sub board 21 and the second sub board 22 (for example, the gap S3a between the thermal-conductive sheets 33 and the second sub board 22), and a gap S4 between the second sub board 22 and the second main wall 15 of the housing 2. The air that has flowed through the gaps S1, S2, S3, and S4 passes through the gap g1 between the first guide portion 54b and the second guide portion 54c of the second spacer 26, and the gap g2 between the first guide portion 54b and the third guide portion 54d, and then is exhausted through the second vent holes 19 to the outside of the housing 2.

At this time, as illustrated in FIG. 7, a flow direction of air that has flowed to the −X direction through the gap S0 between the two capacitors 30A and 30B is changed toward the gap S3a between the first thermal-conductive sheet 33A and the second sub board 22, and the gap S3a between the second thermal-conductive sheet 33B and the second sub board 22 at the guide portion 53b. As a result, even if the capacitor 30 is a relatively large component, a greater amount of air is supplied also toward the rear of the capacitors 30 on the −X direction side.

Therefore, heat dissipation of the thermal-conductive sheets 33 is promoted.

Further, when the semiconductor storage device 1 is placed, where air flows to the +X direction, a flow of the air is opposite to that in the example illustrated in FIGS. 6 and 7. In this case, a flow direction of some of the air that has flowed into the housing 2 from the second vent holes 19 is changed toward the gap S3a between the first thermal-conductive sheet 33A and the second sub board 22, and the gap S3a between the second thermal-conductive sheet 33B and the second sub board 22 at the first guide portion 54b of the second spacer 26.

Note that causing air to flow inside the semiconductor storage device 1 (that is, the operation related to the air flow) is not indispensable. Even in a case in which air does not flow inside the semiconductor storage device 1, when the thermal-conductive sheets 33 are provided, the capacitors 30 function as heat sinks, and a temperature rise in the first sub board 21 can be suppressed.

[6. Advantages]

In the semiconductor storage device 1 of the present embodiment, the thermal-conductive sheets 33 are provided to extend over the NANDs 31A and the capacitors 30. According to such a configuration, heat inside the semiconductor storage device 1 (for example, heat of the NANDs 31A) is moved to the capacitors 30, and thereby the heat inside the semiconductor storage device 1 can be more efficiently dissipated. Therefore, heat dissipation of the semiconductor storage device 1 can be improved.

For example, according to one experimental result by the present inventors, in a configuration of a comparative example in which the thermal-conductive sheet 33 was not provided, a temperature of the NAND 31AA was 59.5 degrees Celcius and a temperature of the capacitor 30 was 35.1 degrees Celcius, and, in contrast, in a configuration in which the thermal-conductive sheet 33 was provided, a temperature of the NAND 31AA was 55.9 degrees Celcius and a temperature of the capacitor 30 was 40.2 degrees Celcius.

From this experimental result, it is ascertained that the heat dissipation of the semiconductor storage device 1 can be improved when the thermal-conductive sheets 33 are provided.

In the present embodiment, since the NANDs 31A mounted on the first sub board 21 are interposed between the first sub board 21 and the second sub board 22, heat of the NANDs 31A can not easily be conducted to the housing 2.

However, in the present embodiment, the NANDs 31A and the capacitors 30 are thermally connected by the thermal-conductive sheets 33, and thereby heat of the NANDs 31A positioned between the first sub board 21 and the second sub board 22 can be efficiently dissipated.

In the present embodiment, the thickness T3 in the Z direction of the thermal-conductive sheet 33 is smaller than the thickness T2 in the Z direction of the second spacer 26. According to such a configuration, even when the thermal-conductive sheets 33 are disposed between the first sub board 21 and the second sub board 22, the gap S3a through which air flows between the thermal-conductive sheets 33 and the second sub board 22 can be secured. Therefore, the heat dissipation of the semiconductor storage device 1 can be further improved.

In the present embodiment, a part of the NANDs 31A is positioned closer to the second vent holes 19 than to the first vent holes 18 of the housing 2. On the other hand, the capacitors 30 are positioned closer to the first vent holes 18 than to the second vent holes 19 of the housing 2. Also, the thermal-conductive sheets 33 extend from the above-described NANDs 31A to the capacitors 30. According to such a configuration, when the first vent holes 18 function as suction holes, heat of the NANDs 31A, which are disposed far from the first vent holes 18 and whose temperatures tend to rise due to the air warmed by the controller 27 or the NANDs 31 flowing therearound, can be conducted to the capacitors 30, which is positioned close to the first vent holes 18 and easily dissipates heat. Therefore, the heat dissipation of the semiconductor storage device 1 can be further improved.

In the present embodiment, the thermal-conductive sheets 33 overlap in the Z direction the plurality of NANDs 31A aligned in the X direction. According to such a configuration, heat dissipation of the plurality of NANDs 31A can be collectively improved.

In the present embodiment, the first thermal-conductive sheet 33A overlaps in the Z direction the plurality of NANDs 31A included in the first group and the plurality of NANDs 31A included in the second group. According to such a configuration, heat dissipation for more NANDs 31A can be improved.

In the present embodiment, at least a part of an outer shape of the capacitor 30 has the curved surface 41a.

A part of the thermal-conductive sheet 33 is attached to the capacitor 30 in a state of being bent along the curved surface 41a. According to such a configuration, a large contact area of the capacitor 30 having the curved surface 41a and the thermal-conductive sheet 33 can be secured. Therefore, the heat dissipation of the semiconductor storage device 1 can be further improved.

In the present embodiment, a part of the thermal-conductive sheets 33 is positioned between the first vent holes 18 of the housing 2 and the capacitors 30. According to such a configuration, larger contact area between the capacitors 30 and the thermal-conductive sheets 33 can be secured by utilizing a space between the first vent holes 18 of the housing 2 and the capacitors 30. Therefore, the heat dissipation of the semiconductor storage device 1 can be further improved. Also, when a part of the thermal-conductive sheets 33 is positioned between the first vent holes 18 of the housing 2 and the capacitors 30, the thermal-conductive sheets 33 can be efficiently cooled by cold air that has flowed into the housing 2 from the first vent holes 18. Also from this perspective, the heat dissipation of the semiconductor storage device 1 can be further improved.

In the present embodiment, the second spacer 26 includes the guide portion 53b which directs some of the air that has flowed into the housing 2 from the first vent holes 18 toward the gap S3a between the thermal-conductive sheets 33 and the second sub board 22. According to such a configuration, a large amount of air can flow through the gap S3a between the thermal-conductive sheets 33 and the second sub board 22 compared to a case in which the guide portion 53b is not provided. Therefore, the thermal-conductive sheets 33 can be directly cooled, and the heat dissipation of the semiconductor storage device 1 can be further improved.

Also, since the thermal-conductive sheets 33 cover at least a part of the NANDs 31A, dust that has flowed into the inside of the housing 2 along with air does not likely adhere to the NANDs 31A. Therefore, reliability of the semiconductor storage device 1 is also improved.

Next, some modified examples of the first embodiment will be described. In each of the modified examples, configurations other than those described below are the same as the configurations of the first embodiment. Also, these modified examples may be implemented in combination with other embodiments described below.

First Modified Example

Figure 9:
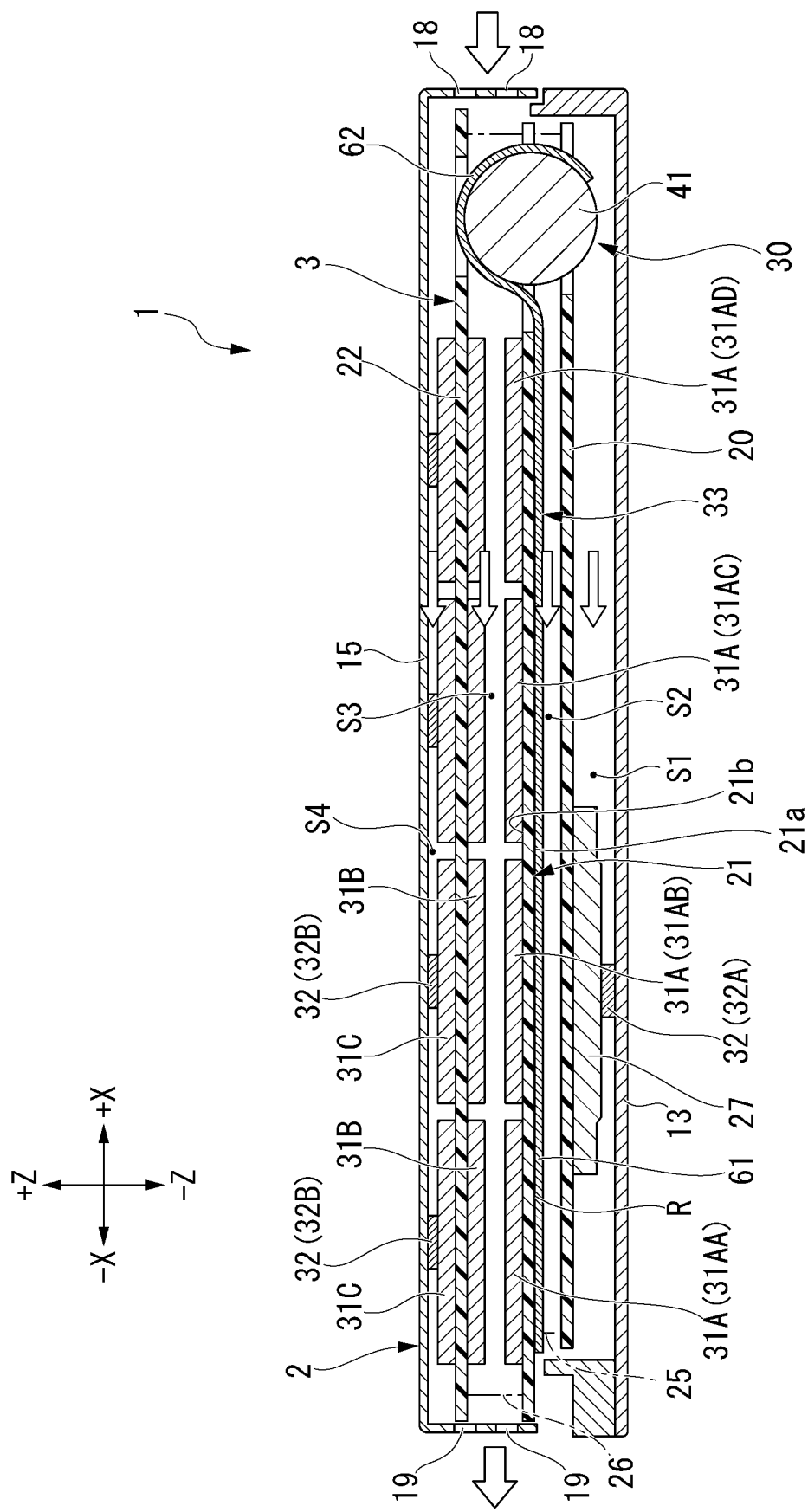
FIG. 9 is a cross-sectional view illustrating the semiconductor storage device of a first modified example of the first embodiment.

FIG. 9 is a cross-sectional view illustrating the semiconductor storage device 1 of a first modified example. In the first modified example, the first part 61 of each of the thermal-conductive sheets 33 is disposed between the main board 20 and the first sub board 21.

The first part 61 of the thermal-conductive sheet 33 is attached to a region R (hereinafter also referred to as "rear-side region R") of the first sub board 21 positioned on a rear side of the plurality of NANDs 31A and overlaps the plurality of NANDs 31A in the Z direction. The thermal-conductive sheets 33 are provided to extend over the rear-side region R and the capacitors 30. The thermal-conductive sheets 33 thermally connect, via the first sub board 21, the plurality of NANDs 31A and the capacitors 30.

Second Modified Example

Figure 10:
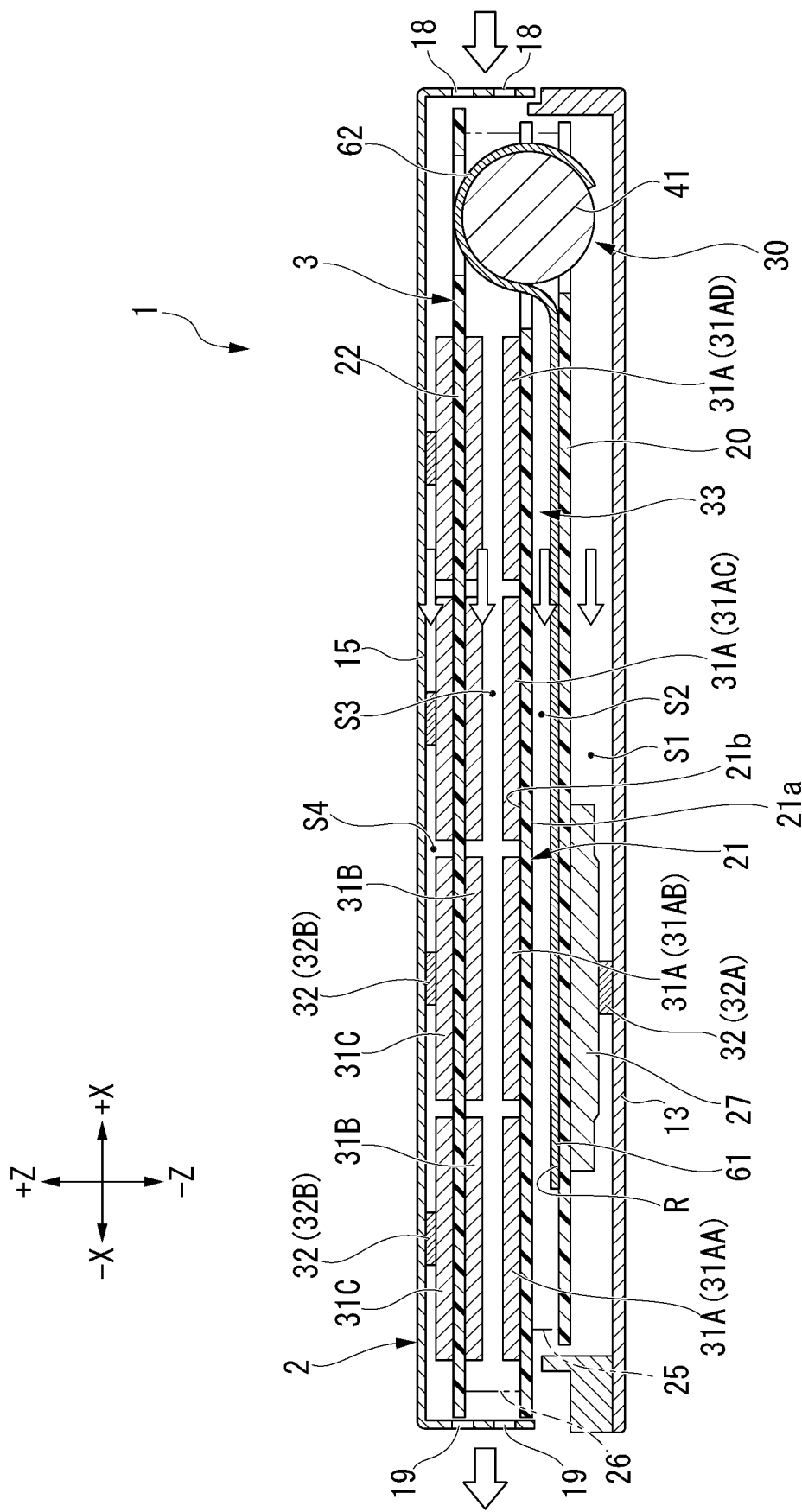
FIG. 10 is a cross-sectional view illustrating the semiconductor storage device of a second modified example of the first embodiment.

FIG. 10 is a cross-sectional view illustrating the semiconductor storage device 1 of a second modified example. In the second modified example, the first part 61 of each of the thermal-conductive sheets 33 is disposed between the main board 20 and the first sub board 21. The first part 61 of the thermal-conductive sheet 33 is attached to a region R (rear-side region R) of the main board 20 positioned on a rear side of the controller 27 and overlaps the controller 27 in the Z direction. The thermal-conductive sheets 33 are provided to extend over the rear-side region R and the capacitors 30. The thermal-conductive sheets 33 thermally connect, via the main board 20, the controller 27 and the capacitors 30.

According to such a configuration, heat of the controller 27 is moved to the capacitors 30, and thereby the heat of the controller 27 can be more efficiently dissipated. Therefore, the heat dissipation of the semiconductor storage device 1 can be improved. In the present modified example, the controller 27 is an example of the "heat generating component." The main board 20 is an example of the "first board." The first sub board 21 is an example of the "second board."

Instead of the above-described configuration of the second modified example, the thermal-conductive sheets 33 may be disposed between the first main wall 13 of the housing 2 and the main board 20, and may be attached to the controller 27 from a side opposite to the main board 20 (that is, from the first main wall 13 side of the housing 2). According to such a configuration, the heat of the controller 27 can be directly transmitted to the thermal-conductive sheets 33.

Third Modified Example

Figure 11:
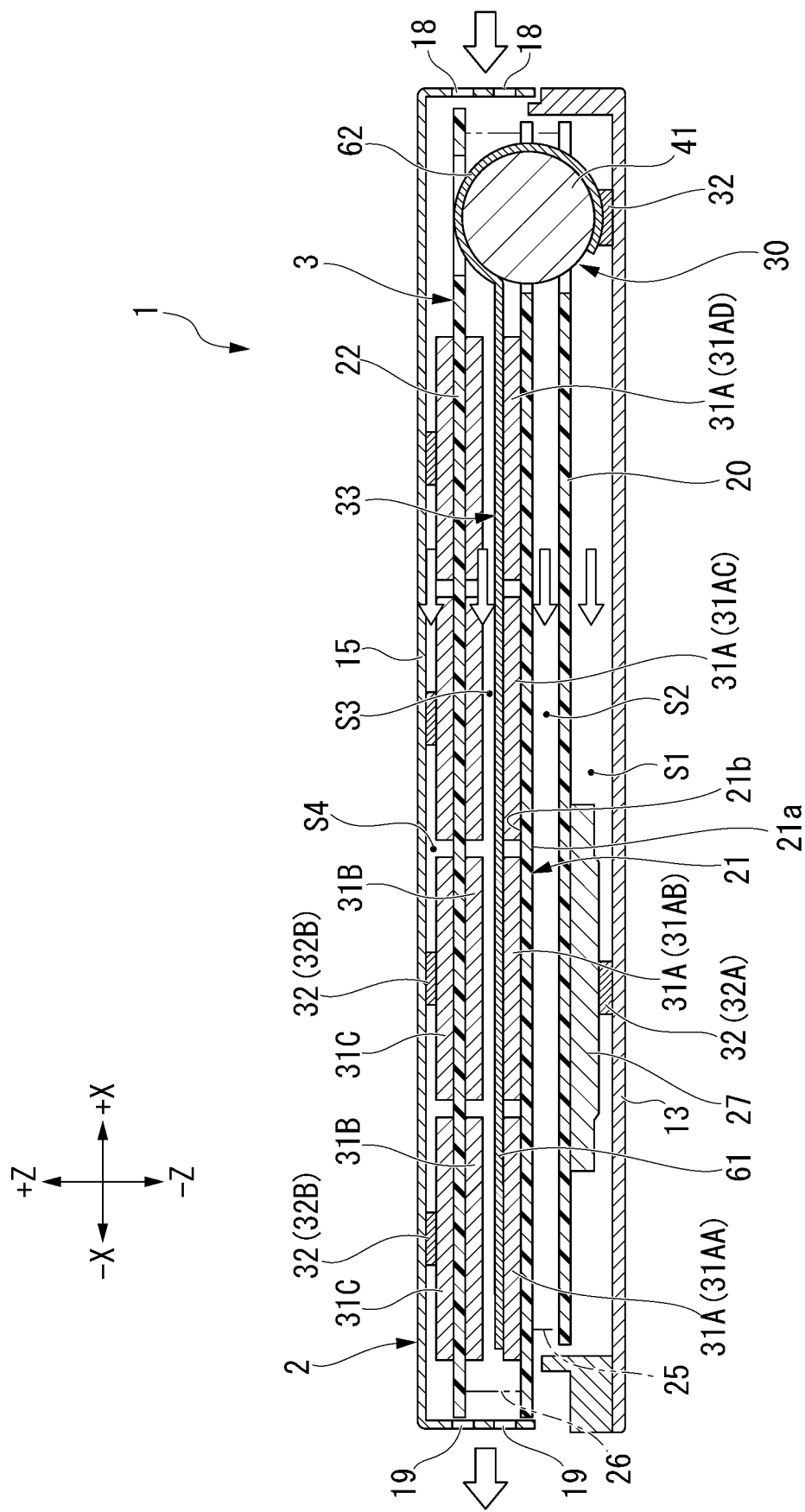
FIG. 11 is a cross-sectional view illustrating the semiconductor storage device of a third modified example of the first embodiment.

FIG. 11 is a cross-sectional view illustrating the semiconductor storage device 1 of a third modified example. In the third modified example, the semiconductor storage device 1 includes the thermal connection component 32 which thermally connects the second part 62 of each of the thermal-conductive sheets 33 and the first main wall 13 of the housing 2. The thermal connection component 32 may have, for example, elasticity (or flexibility) and be interposed between the capacitor 30 (the second part 62 of the thermal-conductive sheet 33) and the first main wall 13 of the housing 2. According to such a configuration, some of the heat moved from the NANDs 31A to the thermal-conductive sheets 33 can be dissipated to the housing 2.

Therefore, the heat dissipation of the semiconductor storage device 1 can be further improved.

Fourth Modified Example

Figure 12:
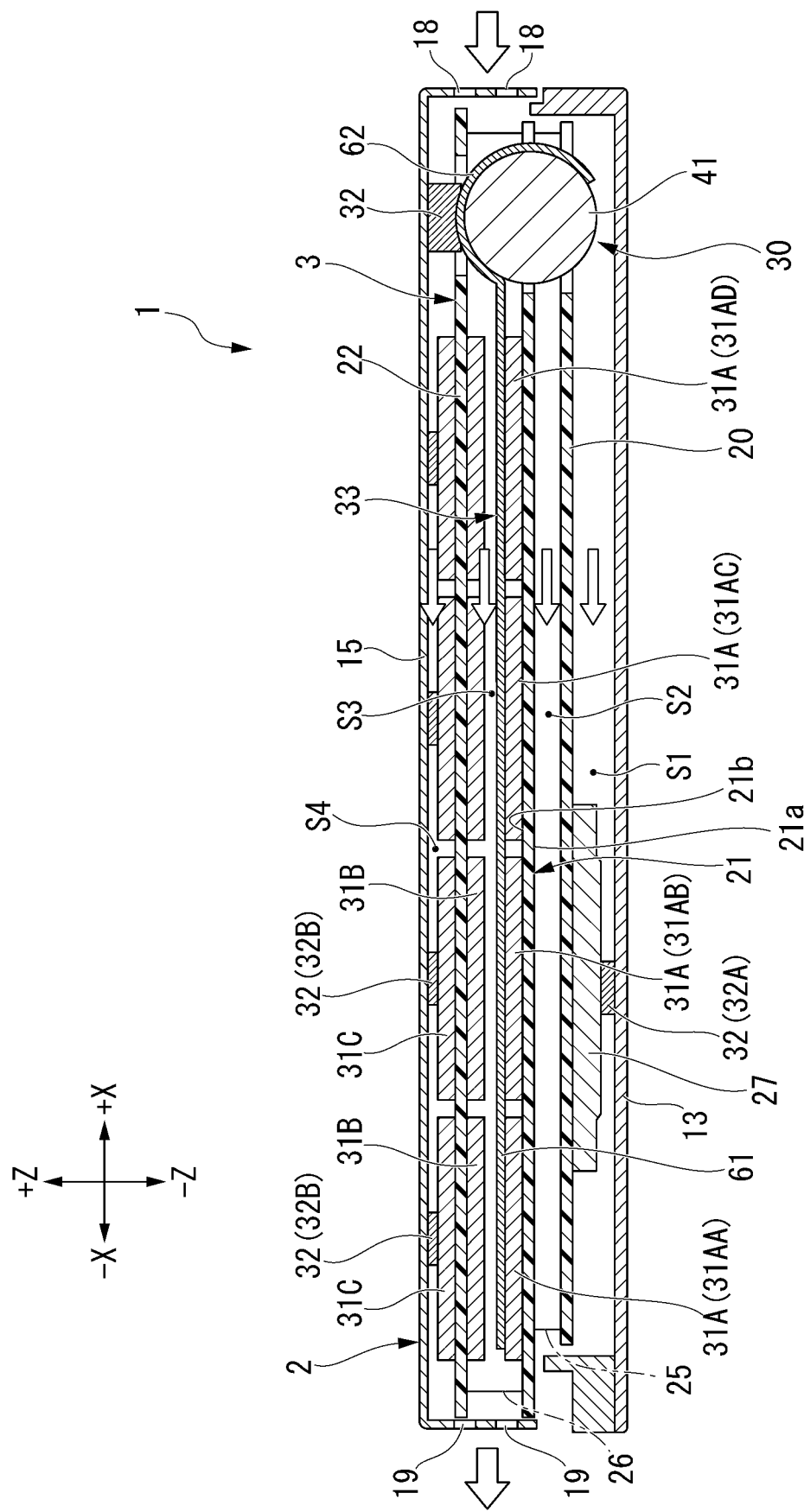
FIG. 12 is a cross-sectional view illustrating the semiconductor storage device of a fourth modified example of the first embodiment.

FIG. 12 is a cross-sectional view illustrating the semiconductor storage device 1 of a fourth modified example. In the fourth modified example, the semiconductor storage device 1 includes the thermal connection component 32 which thermally connects the second part 62 of each of the thermal-conductive sheets 33 and the second main wall 15 of the housing 2. The thermal connection component 32 may have, for example, elasticity (or flexibility), and be interposed between the capacitor 30 (the second part 62 of the thermal-conductive sheet 33) and the second main wall 15 of the housing 2. According to such a configuration, some of the heat moved from the NANDs 31A to the thermal-conductive sheets 33 can be dissipated to the housing 2.

Therefore, the heat dissipation of the semiconductor storage device 1 can be further improved.

Second Embodiment

Next, a semiconductor storage device 1 of a second embodiment will be described. The second embodiment differs from the first embodiment in that a capacitor 30 is disposed at a position overlapping a board 20 in the Z direction. Configurations other than those described below are the same as the configurations of the first embodiment.

Figure 13:
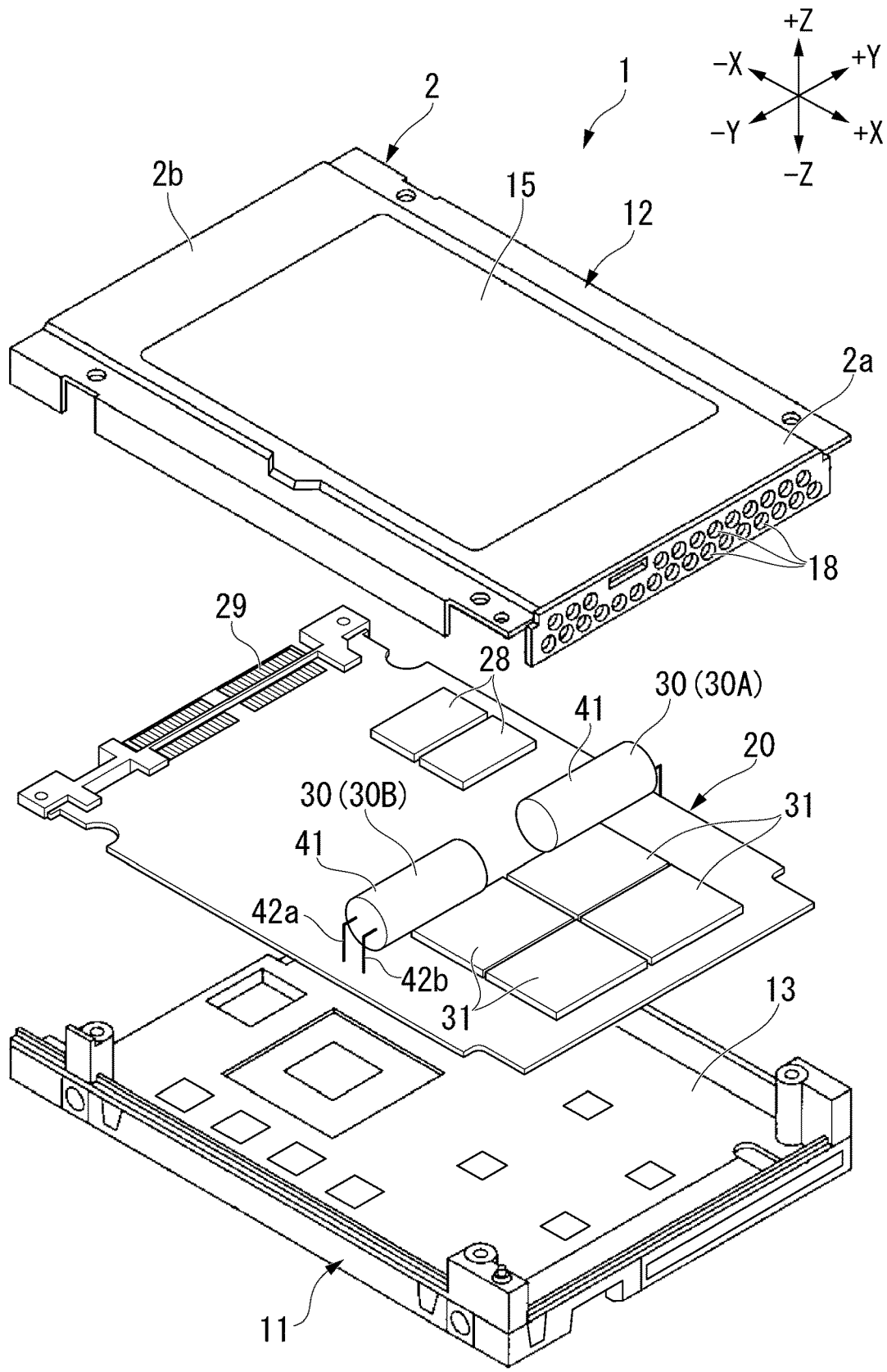
FIG. 13 is a partially exploded perspective view illustrating a semiconductor storage device of a second embodiment.

FIG. 13 is a partially exploded perspective view illustrating the semiconductor storage device 1. The semiconductor storage device 1 includes, for example, a housing 2, the board 20, a controller (not illustrated) 27, a plurality of DRAMs 28, an external connector 29, a plurality of capacitors 30, a plurality of NANDs 31, and a plurality of thermal-conductive sheets 33 (see FIG. 14). In the present embodiment, the controller 27, the DRAMs 28, the external connector 29, the plurality of capacitors 30, and the plurality of NANDs 31 are mounted on the board 20. The capacitors 30 are disposed at positions overlapping the board 20 in the Z direction. For example, the capacitors 30 may be positioned between the board 20 and a second main wall 15 of the housing 2.

Figure 14:
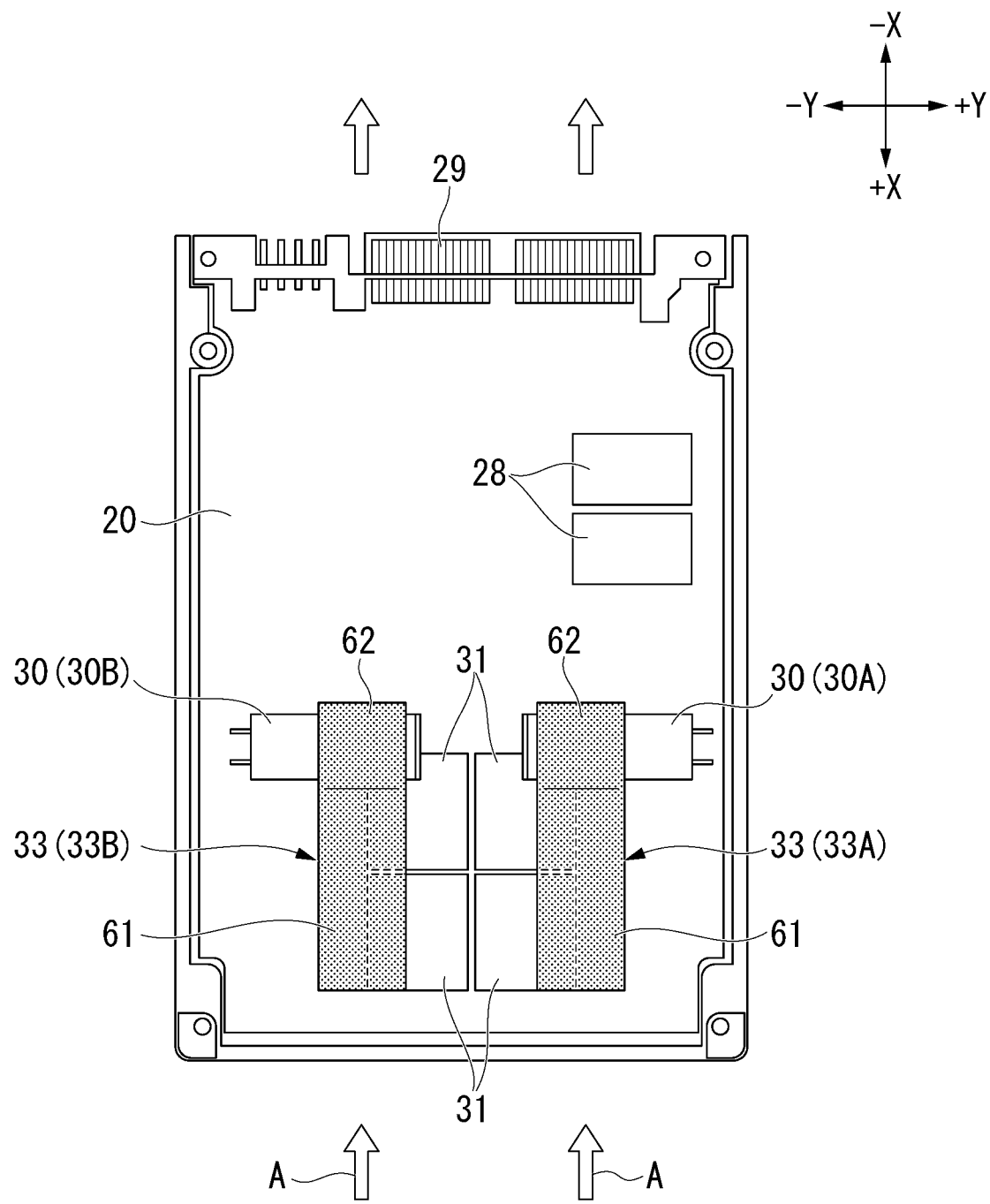
FIG. 14 is a plan view illustrating a planar disposition structure of a thermal-conductive sheet of the semiconductor storage device of the second embodiment.

FIG. 14 is a plan view illustrating a planar disposition structure of the thermal-conductive sheets 33. A first thermal-conductive sheet 33A is provided to extend over the NANDs 31 and a first capacitor 30A, and thermally connects the NANDs 31 and the first capacitor 30A. A second thermal-conductive sheet 33B is provided to extend over the NANDs 31 and a second capacitor 30B, and thermally connects the NANDs 31 and the second capacitor 30B.

According to such a configuration, heat inside the semiconductor storage device 1 (for example, heat of the NANDs 31) is moved to the capacitors 30, and thereby the heat inside the semiconductor storage device 1 can be more efficiently dissipated. Therefore, heat dissipation of the semiconductor storage device 1 can be improved.

Third Embodiment

Next, a semiconductor storage device 1 of a third embodiment will be described. The third embodiment differs from the first embodiment in that heat of NANDs 31A is conducted to other NANDs 31B or a housing 2 via thermal-conductive sheets 33. Configurations other than those described below are the same as the configurations of the first embodiment.

Figure 15:
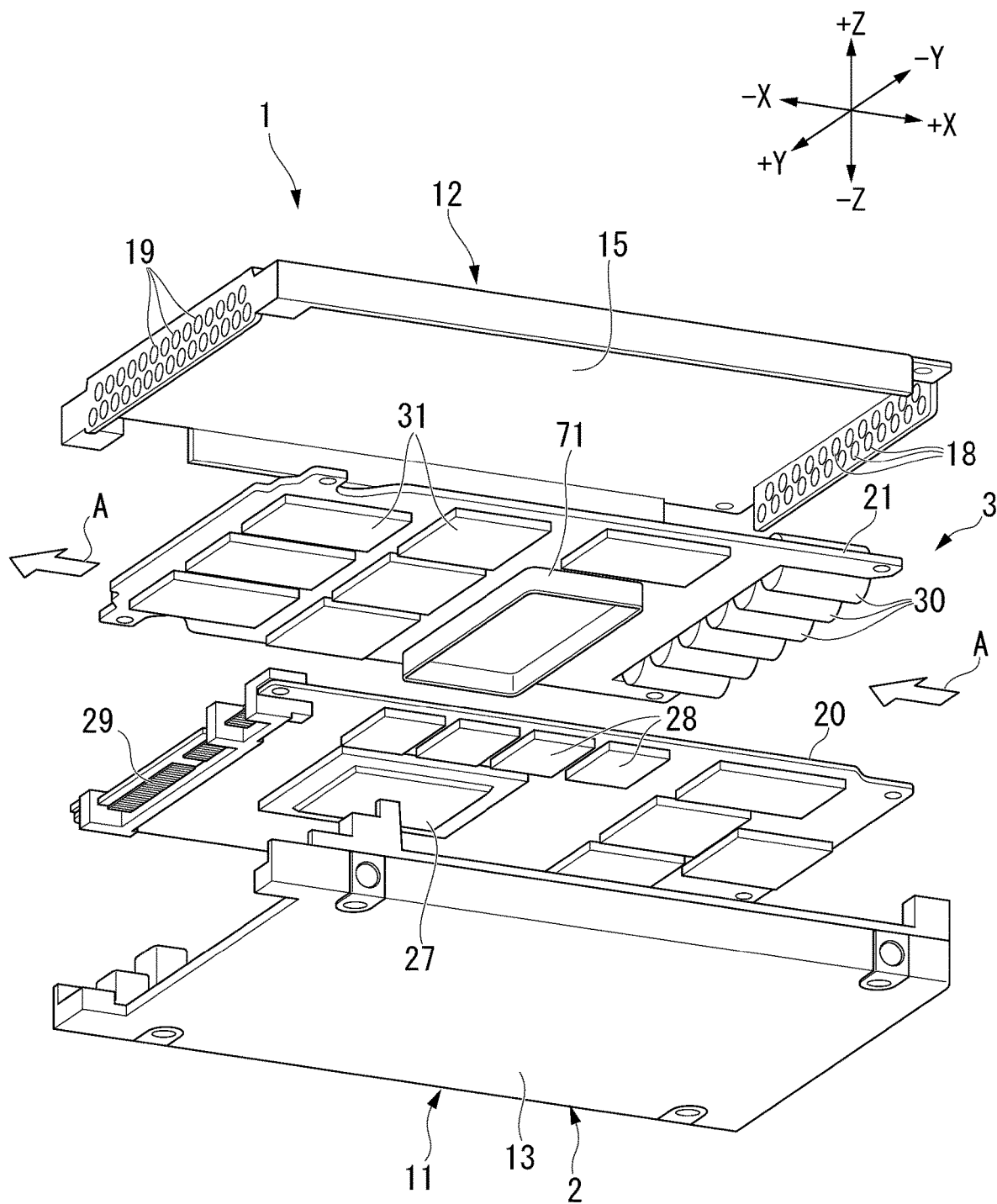
FIG. 15 is a partially exploded perspective view illustrating a semiconductor storage device of a third embodiment.

FIG. 15 is a partially exploded perspective view illustrating the semiconductor storage device 1. The semiconductor storage device 1 may include, for example, the housing 2, a main board 20, a sub board 21, a controller 27, a plurality of DRAMs 28, an external connector 29, a plurality of NANDs 31, a plurality of capacitors 30, and a plurality of thermal-conductive sheets 33 (see FIG. 16). In the present embodiment, the thermal-conductive sheet 33 includes a first thermal-conductive sheet 33A, a second thermal-conductive sheet 33B, and a third thermal-conductive sheet 33C.

Figure 16:
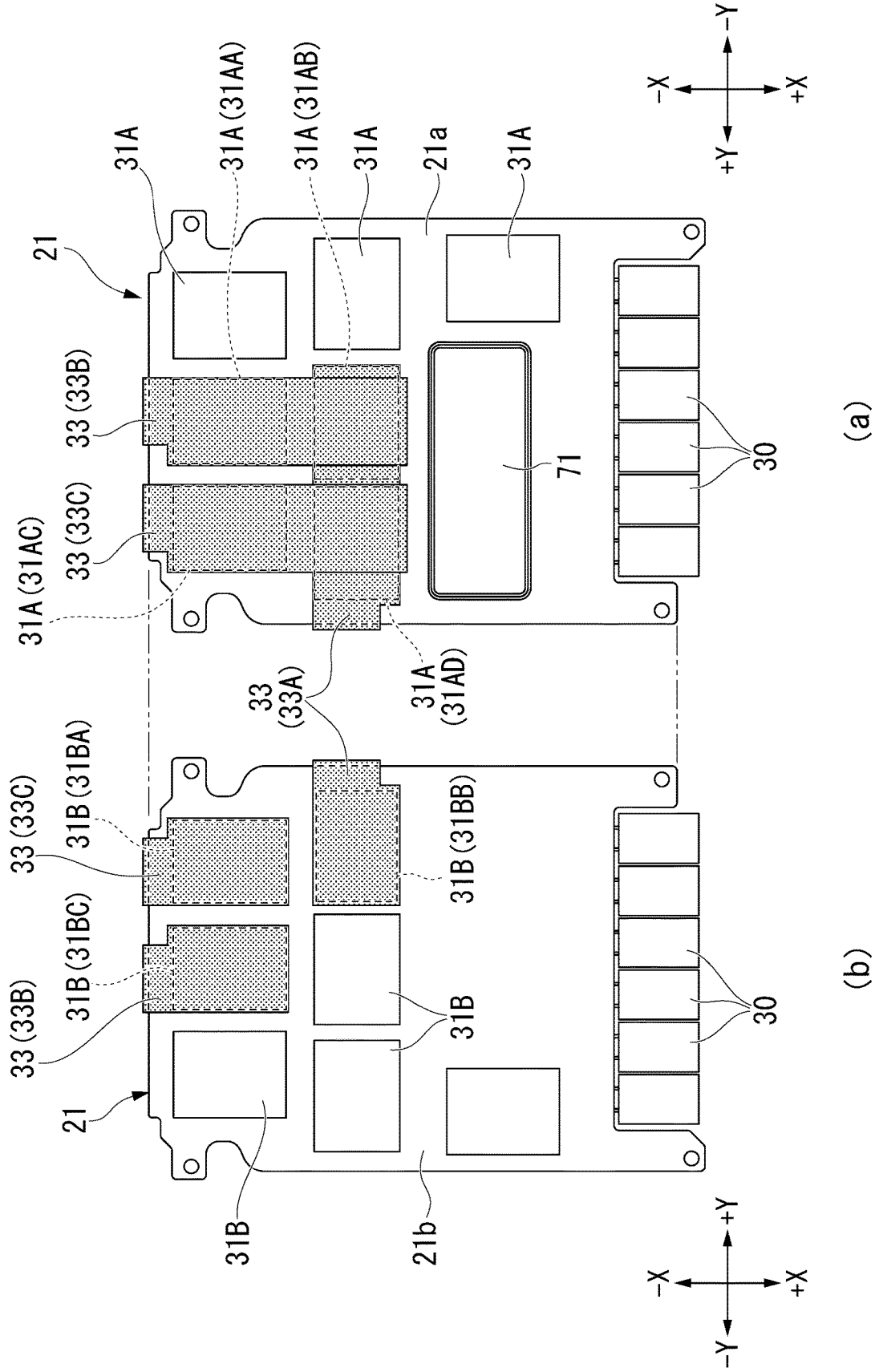
FIG. 16 is a plan view illustrating a sub board of the semiconductor storage device of the third embodiment.

FIG. 16 is a plan view illustrating the sub board 21. The sub board 21 includes a first surface 21a facing the main board 20 and a second surface 21b positioned on a side opposite to the first surface 21a and facing a second main wall 15 of the housing 2. Part (a) of FIG. 16 illustrates the first surface 21a of the sub board 21. Part (b) of FIG. 16 illustrates the second surface 21b of the sub board 21.

In the present embodiment, a board-to-board connector 71 is provided between a part of the NANDs 31 and the capacitors 30 in the X direction. The board-to-board connector 71 extends in the Z direction between the main board 20 and the sub board 21, and physically and electrically connects the main board 20 and the sub board 21.

In the present embodiment, the NANDs 31 include a plurality of NANDs 31A mounted on the first surface 21a of the sub board 21 and a plurality of NANDs 31B mounted on the second surface 21b of the sub board 21.

The plurality of NANDs 31A mounted on the first surface 21a include NANDs 31AA, 31AB, 31AC, and 31AD. The NAND 31AA and the NAND 31AB are aligned in the +X direction in this order. The NAND 31AC and the NAND 31AD are positioned in the +Y direction with respect to the NAND 31AA and the NAND 31AB, and are aligned in the +X direction in this order.

In the present embodiment, the NANDs 31AA, 31AB, 31AC, and 31AD are disposed in a region in which they overlap the controller 27 mounted on the main board 20 in the Z direction, and thus temperatures thereof are likely to rise among the NANDs 31 mounted on the sub board 21. In the present embodiment, each of the NANDs 31AA, 31AB, 31AC, and 31AD is an example of a "heat generating component." Note that the "heat generating component" whose heat is dissipated by the thermal-conductive sheets 33 is not limited to the NANDs 31 and may be the controller 27 or the DRAMs 28.

On the other hand, the plurality of NANDs 31B mounted on the second surface 21b include NANDs 31BA, 31BB, and 31BC. On the sub board 21, the NANDs 31BA, 31BB, and 31BC are mounted on a rear side of the NANDs 31AA, 31AC, and 31AD. In the present embodiment, each of the NANDs 31BA, 31BB, and 31BC is an example of an "electronic component."

Figure 17:
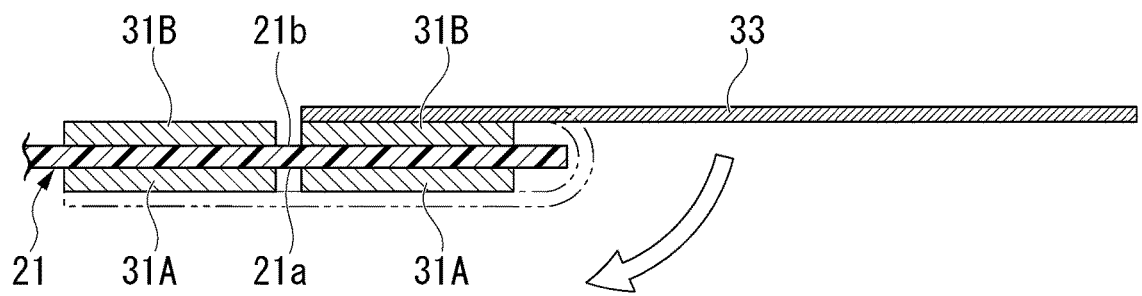
FIG. 17 is a cross-sectional view illustrating an attachment process of a thermal-conductive sheet of the semiconductor storage device of the third embodiment.
Figure 18:
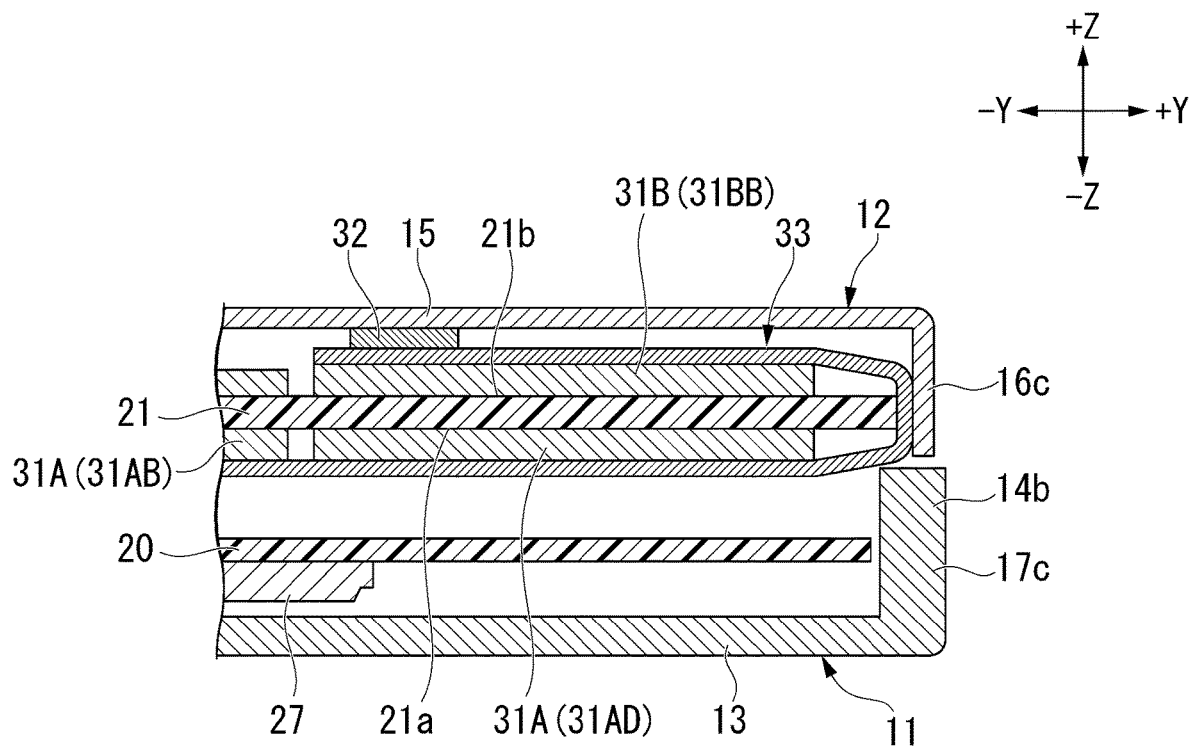
FIG. 18 is a cross-sectional view illustrating the semiconductor storage device of the third embodiment.

FIG. 17 is a cross-sectional view illustrating an attachment process of the first thermal-conductive sheet 33A. FIG. 18 is a cross-sectional view illustrating the semiconductor storage device 1. In the present embodiment, the first thermal-conductive sheet 33A extends in the Y direction. The first thermal-conductive sheet 33A is provided to extend from the NANDs 31AB and 31AD to the NAND 31BB in a posture of being bent to sandwich the sub board 21, and thermally connects the NANDs 31AB and 31AD to the NAND 31BB. Therefore, heat of the NANDs 31AB and 31AD can be dissipated by moving the heat of the NANDs 31AB and 31AD to the NAND 31BB.

Next, returning to FIG. 16, the second and third thermal-conductive sheets 33B and 33C will be described. The second thermal-conductive sheet 33B extends in the X direction. The second thermal-conductive sheet 33B is provided to extend from the NANDs 31AA and 31AB to the NAND 31BC in a posture of being bent to sandwich the sub board 21, and thermally connects the NANDs 31AA and 31AB to the NAND 31BC. Therefore, heat of the NANDs 31AA and 31AB can be dissipated by moving the heat of the NANDs 31AA and 31AB to the NAND 31BC. Both the second thermal-conductive sheet 33B and the first thermal-conductive sheet 33A overlap the NAND 31AB.

Similarly, the third thermal-conductive sheet 33C extends in the X direction. The third thermal-conductive sheet 33C is provided to extend from the NANDs 31AC and 31AD to the NAND 31BA in a posture of being bent to sandwich the sub board 21, and thermally connects the NANDs 31AC and 31AD to the NAND 31BA. Therefore, heat of the NANDs 31AC and 31AD can be dissipated by moving the heat of the NANDs 31AC and 31AD to the NAND 31BA. Both the third thermal-conductive sheet 33C and the first thermal-conductive sheet 33A overlap the NAND 31AD.

In the present embodiment, the semiconductor storage device 1 includes a plurality of thermal connection components 32 that thermally connect the NANDs 31B and the second main wall 15 of the housing 2 (see FIG. 18). The plurality of thermal connection components 32 may have, for example, elasticity (or flexibility) and be interposed between the NANDs 31B (the thermal-conductive sheets 33) and the second main wall 15 of the housing 2. The plurality of thermal connection components 32 thermally connect the thermal-conductive sheets 33 and the housing 2. According to such a configuration, some of the heat that has moved from the NANDs 31A to the thermal-conductive sheets 33 can be dissipated to the housing 2. Therefore, heat dissipation of the semiconductor storage device 1 can be further improved. Instead of the above-described configuration, the thermal connection components 32 may be interposed between the NANDs 31B and the second main wall 15 of the housing 2 in a region in which they do not overlap the thermal-conductive sheets 33 to thermally connect the NANDs 31B and the housing 2. In this case, some of the heat that has been conducted from the thermal-conductive sheets 33 to the NANDs 31B can be conducted to the housing 2 via the thermal connection components 32.

Next, some modified examples of the third embodiment will be described. In each of the modified examples, configurations other than those described below are the same as the configurations of the third embodiment. Also, these modified examples may be implemented in combination with other embodiments described above.

First Modified Example

Figure 19:
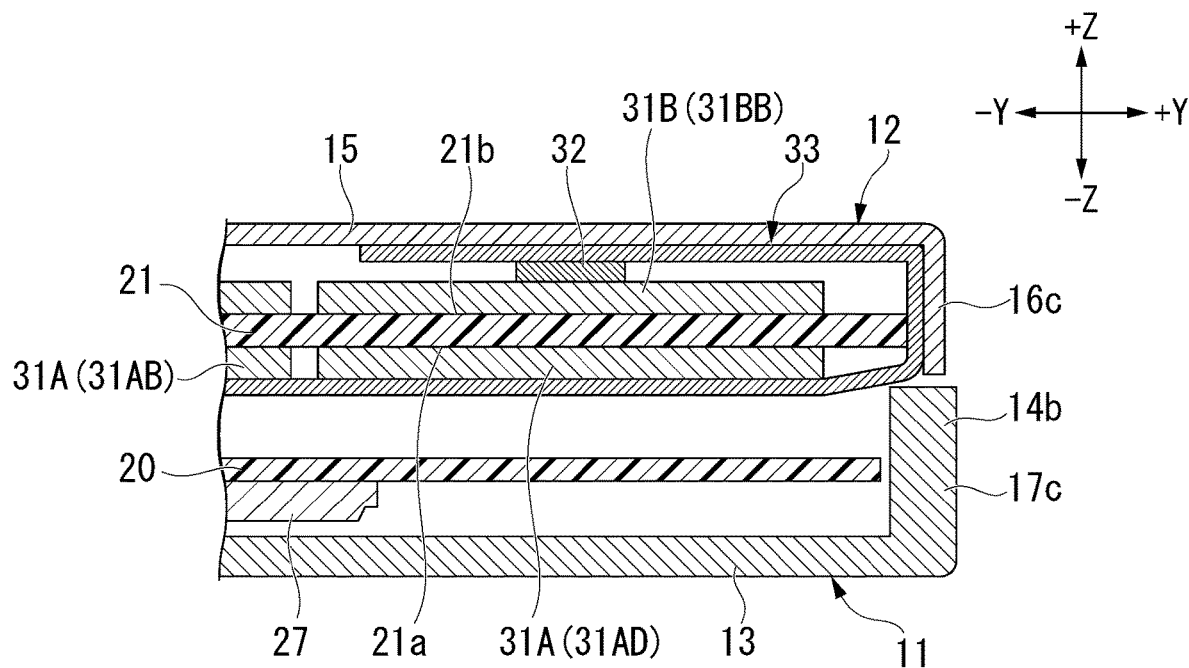
FIG. 19 is a cross-sectional view illustrating the semiconductor storage device of a first modified example of the third embodiment.

FIG. 19 is a cross-sectional view illustrating the semiconductor storage device 1 of a first modified example. In the present modified example, the thermal-conductive sheets 33 are provided to extend over the NANDs 31A and the housing 2, and thermally connect the NANDs 31A and the housing 2. In the present modified example, the thermal-conductive sheets 33 are attached to the inner surface of a side wall portion 16c of the cover 12 and the inner surface of the second main wall 15.

Second Modified Example

Figure 20:
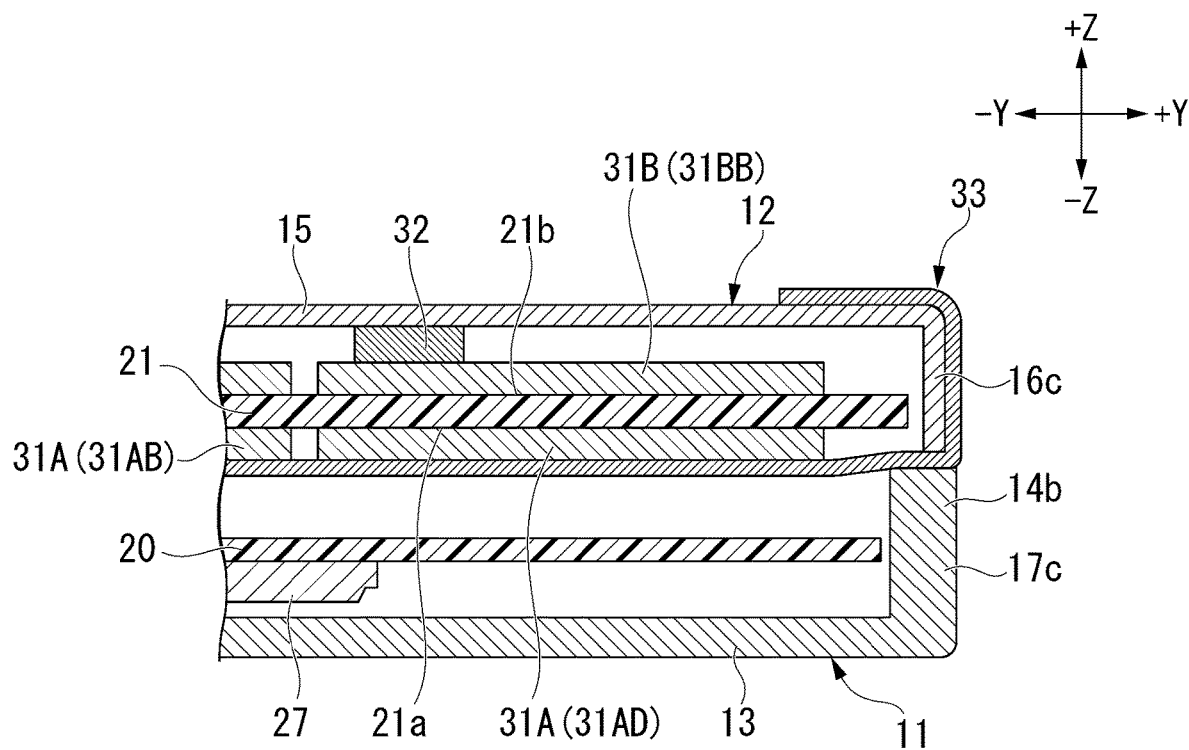
FIG. 20 is a cross-sectional view illustrating the semiconductor storage device of a second modified example of the third embodiment.

FIG. 20 is a cross-sectional view illustrating the semiconductor storage device 1 of a second modified example. The thermal-conductive sheets 33 are provided to extend over the NANDs 31A and the housing 2, and thermally connect the NANDs 31A and the housing 2. In the present modified example, the thermal-conductive sheets 33 are attached to the outer surface of the side wall portion 16c of the cover 12 and the outer surface of the second main wall 15 of the housing 2.

Instead of the configuration of the second modified example, the thermal-conductive sheets 33 may be attached to a region (rear-side region) R of the first sub board 21 positioned on a rear side of the NANDs 31A to extend from the rear-side region R of the first sub board 21 to the housing 2. The same applies to the following modified examples.

Third Modified Example

Figure 21:
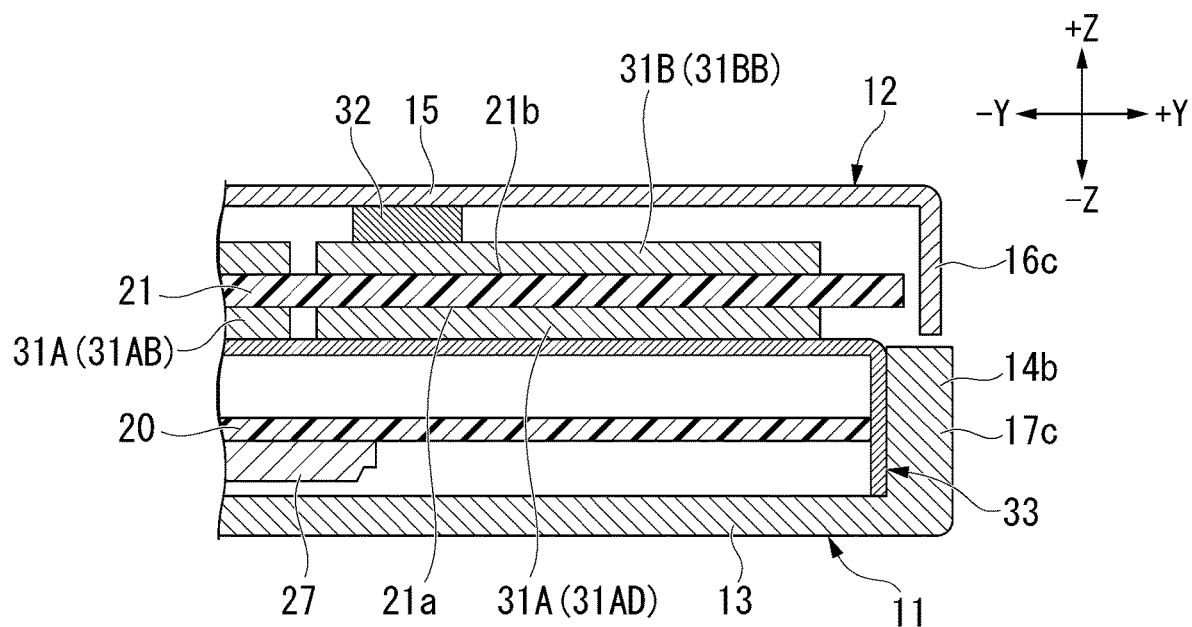
FIG. 21 is a cross-sectional view illustrating the semiconductor storage device of a third modified example of the third embodiment.

FIG. 21 is a cross-sectional view illustrating the semiconductor storage device 1 of a third modified example. In the present modified example, the thermal-conductive sheets 33 are provided to extend over the NANDs 31A and the housing 2 and thermally connect the NANDs 31A and the housing 2. In the present modified example, the thermal-conductive sheets 33 are attached to the inner surface of a side wall portion 14b of a base 11.

Fourth Modified Example

Figure 22:
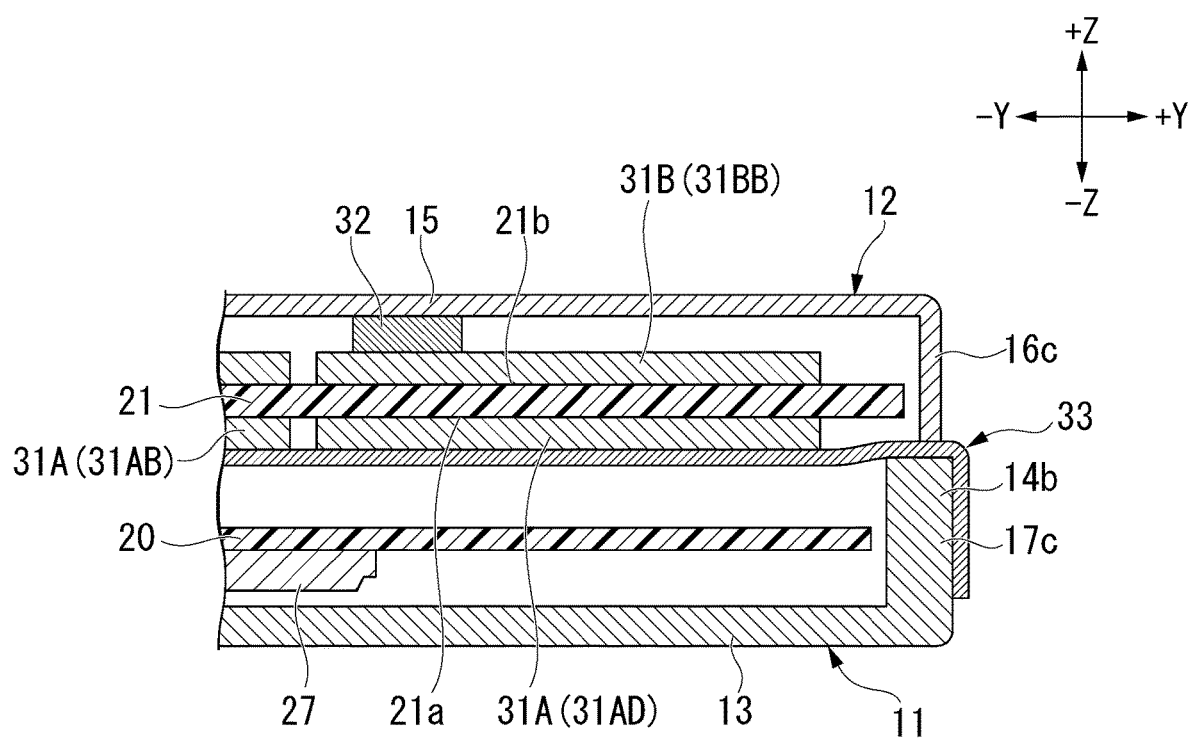
FIG. 22 is a cross-sectional view illustrating the semiconductor storage device of a fourth modified example of the third embodiment.

FIG. 22 is a cross-sectional view illustrating the semiconductor storage device 1 of a fourth modified example. In the present modified example, the thermal-conductive sheets 33 are provided to extend over the NANDs 31A and the housing 2 and thermally connect the NANDs 31A and the housing 2. In the present modified example, the thermal-conductive sheets 33 are attached to the outer surface of the side wall portion 14b of the base 11.

Fifth Modified Example

Figure 23:
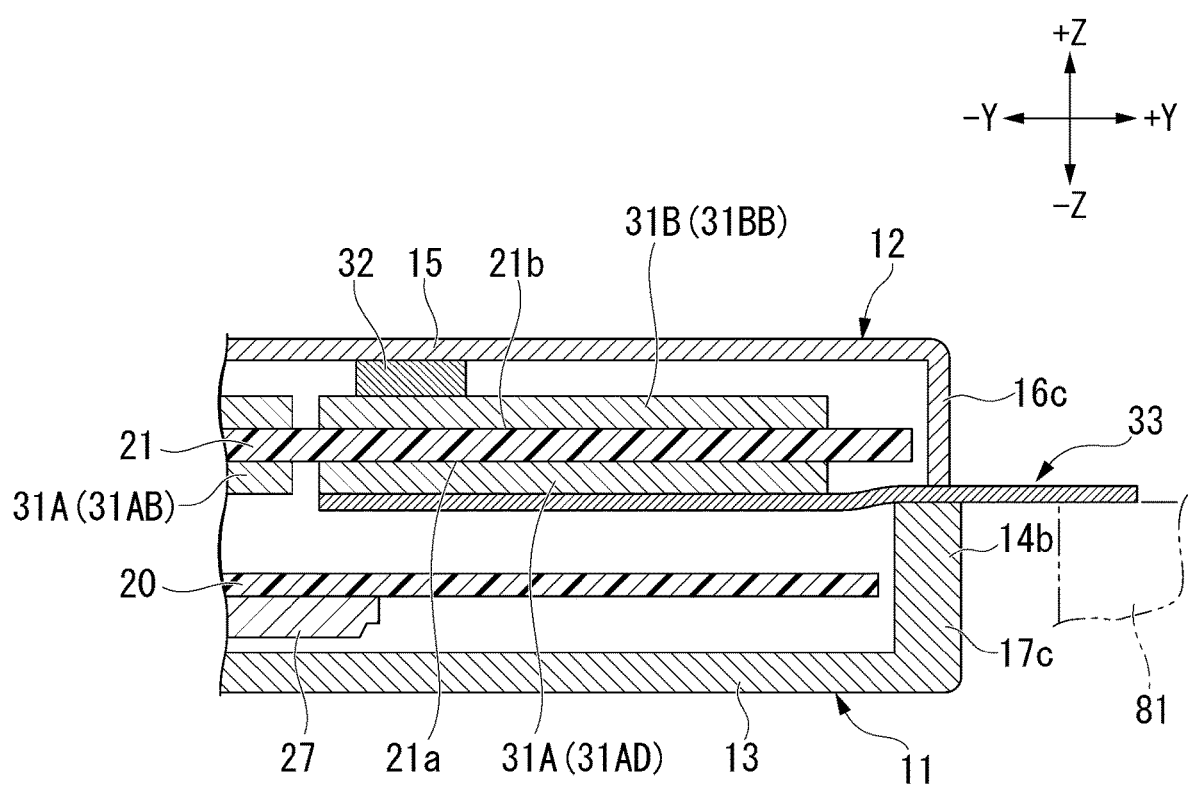
FIG. 23 is a cross-sectional view illustrating the semiconductor storage device of a fifth modified example of the third embodiment.

FIG. 23 is a cross-sectional view illustrating the semiconductor storage device 1 of a fifth modified example. In the present modified example, the thermal-conductive sheets 33 are provided to extend over the NANDs 31A and a heat dissipation component 81 disposed outside the housing 2 and thermally connect the NANDs 31A and the heat dissipation component 81. That is, in the present modified example, a part of the thermal-conductive sheets 33 protrudes to the outside of the housing 2. A part of the thermal-conductive sheets 33 is to be attached to the heat dissipation component 81 (for example, a heat sink provided outside the semiconductor storage device 1) which is an external component.

Instead of the configuration of the fifth modified example, the thermal-conductive sheets 33 may be attached to a region (rear-side region) R of the first sub board 21 positioned on the rear side of the NAND 31A to extend from the rear-side region R of the first sub board 21 to the outside of the housing 2 (for example, to the heat dissipation component 81).

While some embodiments and modified examples have been described above, the embodiments and modified examples are not limited to the above examples. For example, the above-described embodiments and modified examples can be implemented in combination with each other. The "heat generating component" may be other components different from the NANDs 31 and the controller 27 (for example, the DRAMs 28). The "electronic component" is not limited to the capacitors 30 and the NANDs 31, and may be other components.

According to at least one embodiment described above, the semiconductor storage device includes thermal-conductive sheets. The thermal-conductive sheets are provided to extend over a heat generating component and an electronic component, or to extend from a region positioned on a rear side of the heat generating component on the first board to the electronic component, and thermally connect the heat generating component and the electronic component. According to such a configuration, heat dissipation can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
    a housing having a first vent hole, the housing having a first housing surface and a second housing surface, the second housing surface facing the first housing surface;
    a first board accommodated in the housing, the first board having a first surface and a second surface, the second surface being on a side opposite to the first surface, the first surface facing the first housing surface, the second surface facing the second housing surface;
    a heat generating component mounted on the second surface of the first board;
    a capacitor disposed between the heat generating component and the first vent hole, a position in a thickness direction of the first board being between two ends of the capacitor in the thickness direction, the capacitor having a curved surface on at least a part of an outer shape of the capacitor; and
    a thermal-conductive sheet provided to extend over the heat generating component and the capacitor, the thermal-conductive sheet having a first sheet surface, the first sheet surface being in contact with the heat generating component and the capacitor, the thermal-conductive sheet including a first thermal-conductive portion and a second thermal-conductive portion, the first thermal-conductive portion being between the first surface and the first housing surface, the second thermal-conductive portion being between the second surface and the second housing surface, the thermal-conductive sheet having a thermal-conductive curved surface,
    the thermal-conductive curved surface having a same shape as that of the curved surface of the capacitor, the thermal-conductive sheet being attached to the capacitor in a state in which the thermal-conductive curved surface is bent along the curved surface of the capacitor, and wherein the thermal-conductive sheet is between the capacitor and the first and second surfaces.

2. The semiconductor storage device according to claim 1, wherein
    a heat capacity of the capacitor is larger than a heat capacity of the heat generating component.

3. The semiconductor storage device according to claim 1, further comprising:
    a second board disposed between the first board and an inner surface of the housing; and
    a spacer interposed between the first board and the second board, wherein
    at least a part of the thermal-conductive sheet is disposed between the first board and the second board, and
    a thickness of the thermal-conductive sheet in the thickness direction is smaller than a thickness of the spacer in the thickness direction.

4. The semiconductor storage device according to claim 1, further comprising:
    a second board disposed between the heat generating component and an inner surface of the housing, wherein
    a part of the thermal-conductive sheet is disposed between the heat generating component and the second board, and
    the thermal-conductive sheet is provided separately from the second board.

5. The semiconductor storage device according to claim 1, wherein
    the housing has a first end and a second end being positioned on a side opposite to the first end, the first vent hole being provided on the first end, the housing having a second vent hole being provided on the second end,
    the heat generating component is positioned closer to the second vent hole than to the first vent hole, and
    the capacitor is positioned closer to the first vent hole than to the second vent hole.

6. The semiconductor storage device according to claim 1, wherein
    the heat generating component includes a first semiconductor memory component,
    the semiconductor storage device further includes a second semiconductor memory component mounted on the first board and disposed between the first semiconductor memory component and the capacitor, and
    the thermal-conductive sheet is provided to extend over the first semiconductor memory component and the second semiconductor memory component.

7. The semiconductor storage device according to claim 1, wherein
    the heat generating component includes a first semiconductor memory component,
    the semiconductor storage device further includes:
    a second semiconductor memory component mounted on the first board; and
    a third semiconductor memory component mounted on the first board, wherein the second semiconductor memory component is disposed between the first semiconductor memory component and the capacitor, the second semiconductor memory component and the first semiconductor memory component are aligned along a first direction, the first direction being a direction from the first vent hole to the first semiconductor memory component, the third semiconductor memory component and the first semiconductor memory component or the second semiconductor memory component are aligned along a second direction, the second direction being a direction intersecting the first direction, and the thermal-conductive sheet is provided to extend over the first semiconductor memory component, the second semiconductor memory component, and the third semiconductor memory component.

8. The semiconductor storage device according to claim 1, wherein the curved surface of the capacitor includes a curved surface with a central angle of 180 degrees or more, and the thermal-conductive curved surface is attached to the capacitor in a state of being bent along the curved surface of the capacitor with a central angle of 180 degrees or more.

9. The semiconductor storage device according to claim 1, wherein a part of the thermal-conductive sheet is attached to the capacitor at a position between the capacitor and the first vent hole.

10. The semiconductor storage device according to claim 1, further comprising:

a second board disposed between the first board and an inner surface of the housing, wherein a thickness of at least a part of the capacitor in the thickness direction is larger than a distance between the first board and the second board in the thickness direction.

11. The semiconductor storage device according to claim 1, further comprising:

a second board disposed between the first board and an inner surface of the housing; and a spacer interposed between the first board and the second board, wherein at least a part of the thermal-conductive sheet is disposed between the first board and the second board, the spacer includes a guide portion, at least a part of the guide portion being disposed at a position not overlapping the capacitor or the thermal-conductive sheet in a first direction from the first vent hole toward the heat generating component.

12. The semiconductor storage device according to claim 1, further comprising a thermal connection component interposed between the thermal-conductive sheet and the housing and configured to thermally connect the thermal-conductive sheet and the housing.

13. The semiconductor storage device according to claim 1, wherein the first vent hole is provided in a face of the housing being perpendicular to the first board, and the capacitor is disposed between the heat generating component and the first vent hole in the face.

14. The semiconductor storage device according to claim 1, wherein a position of one of the two ends of the capacitor in the thickness direction is between the first surface and the first housing surface in the thickness direction, and a position of the other of the two ends of the capacitor in the thickness direction is between the second surface and the second housing surface in the thickness direction.

15. The semiconductor storage device according to claim 1, wherein a first of the two ends of the capacitor in the thickness direction overlaps the thermal-conductive curved surface between the second surface and the second housing surface in the thickness direction, and a second of the two ends of the capacitor in the thickness direction overlaps the thermal-conductive curved surface between the first surface and the first housing surface in the thickness direction.

16. A semiconductor storage device comprising:

a housing;

a board accommodated in the housing;

a heat generating component mounted on a first surface of the board;

a capacitor mounted on a second surface of the board on a side opposite to the first surface; and a thermal-conductive sheet provided to extend over the heat generating component and the capacitor, the thermal-conductive sheet having a first sheet surface and a second sheet surface, the first sheet surface being in contact with the heat generating component and the capacitor, the second sheet surface being thermally connected to the housing.

17. The semiconductor storage device according to claim 16, further comprising a thermal connection component interposed between the capacitor and the housing or between the thermal-conductive sheet and the housing.

18. A semiconductor storage device comprising:

a housing having a first vent hole, the housing having a first housing surface and a second housing surface, the second housing surface facing the first housing surface;

a first board accommodated in the housing, the first board having a first surface and a second surface, the second surface being on a side opposite to the first surface, the first surface facing the first housing surface, the second surface facing the second housing surface;

a heat generating component mounted on the second surface of the first board;

a capacitor disposed between the heat generating component and the first vent hole, a position in a thickness direction of the first board being between two ends of the capacitor in the thickness direction, the capacitor having a curved surface on at least a part of an outer shape of the capacitor; and a thermal-conductive sheet provided to extend from a region positioned on a rear side of the heat generating component on the first board to the capacitor, the thermal-conductive sheet having a first sheet surface, the first sheet surface facing the first surface, the thermal-conductive sheet including a first thermal-conductive portion and a second thermal-conductive portion, the first thermal-conductive portion being between the first surface and the first housing surface, the second thermal-conductive portion being between the second surface and the second housing surface, the thermal-conductive sheet having a thermal-conductive curved surface, the thermal-conductive curved surface having a same shape as that of the curved surface of the capacitor, the thermal-conductive sheet being attached to the capacitor in a state in which the thermal-conductive curved surface is bent along the curved surface of the capacitor, and wherein the thermal-conductive sheet is between the capacitor and the first and second surfaces.

19. The semiconductor storage device according to claim 18, wherein a first of the two ends of the capacitor in the thickness direction overlaps the thermal-conductive curved surface between the second surface and the second housing surface in the thickness direction, and a second of the two ends of the capacitor in the thickness direction overlaps the thermal-conductive curved surface between the first surface and the first housing surface in the thickness direction.

\* \* \* \* \*